(12) United States Patent
Jheong et al.

(10) Patent No.: US 9,087,866 B2
(45) Date of Patent: Jul. 21, 2015

(54) SUBSTRATE CLEANING/DRYING APPARATUS AND SUBSTRATE PROCESSING APPARATUS COMPRISING THE SAME, AND SUBSTRATE CLEANING/DRYING METHOD AND METHOD FOR MANUFACTURING DISPLAY PANEL

(75) Inventors: Hyeon Yong Jheong, Jung-ri (KR); Ki Bok Kang, Sangju-si (KR)

(73) Assignee: LG Display Co., Ltd., Seoul (KR)

( * ) Notice: Subject to any disclaimer, the term of this patent is extended or adjusted under 35 U.S.C. 154(b) by 256 days.

(21) Appl. No.: 12/962,329

(22) Filed: Dec. 7, 2010

(65) Prior Publication Data

US 2012/0031438 A1 Feb. 9, 2012

(30) Foreign Application Priority Data

Aug. 9, 2010 (KR) .................... 10-2010-0076573

(51) Int. Cl.
*B08B 1/02* (2006.01)
*H01L 21/677* (2006.01)
(Continued)

(52) U.S. Cl.
CPC ............ *H01L 21/6776* (2013.01); *B65G 49/07* (2013.01); *B65G 65/00* (2013.01); *H01L 21/67028* (2013.01); *H01L 21/67736* (2013.01); *H01L 21/67742* (2013.01)

(58) Field of Classification Search
CPC ............... H01L 21/67736; H01L 21/6776; H01L 21/67196; B65G 49/064; B65G 49/06; B65G 49/07
USPC .................................. 414/935–941
See application file for complete search history.

(56) References Cited

U.S. PATENT DOCUMENTS 5,672,040 A * 9/1997 Kimura et al. ............... 414/403
5,989,346 A * 11/1999 Hiroki ........................... 118/719

(Continued)

FOREIGN PATENT DOCUMENTS

JP 2001113441 A * 4/2001
KR 20050004347 A 1/2005

(Continued)

OTHER PUBLICATIONS

JP 2001113441 A—Machine Translation.*

(Continued)

*Primary Examiner* — Michael Kornakov
*Assistant Examiner* — Marc Lorenzi
(74) *Attorney, Agent, or Firm* — Brinks Gilson & Lione

(57) ABSTRACT

A substrate cleaning and drying apparatus includes a first substrate transfer unit operable to transfer a substrate in a horizontal direction at an upper part of a base frame, a second substrate transfer unit operable to receive the substrate from the first substrate transfer unit and transfer the substrate in a vertical direction, a third substrate transfer unit operable to receive the substrate from the second substrate transfer unit and transfer the substrate in a horizontal direction at a lower part of the base frame, and a substrate processing unit operable to receive the substrate from the third substrate transfer unit and perform a cleaning and drying process on the substrate to clean and dry the substrate. The second substrate transfer unit includes a plurality of first hand forks operable to support the substrate. The third substrate transfer unit includes a plurality of first roller frames disposed parallel to each other in a horizontal direction at a fixed interval so that the plurality of first hand forks may pass through the plurality of first roller frames in a vertical direction.

12 Claims, 14 Drawing Sheets

(51) Int. Cl.
  *B65G 49/07* (2006.01)
  *B65G 65/00* (2006.01)
  *H01L 21/67* (2006.01)

(56) References Cited

U.S. PATENT DOCUMENTS

| | | | |
|---|---|---|---|
| 7,401,828 B2 * | 7/2008 | Yang | 294/119.1 |
| 2002/0025244 A1 * | 2/2002 | Kim | 414/217 |
| 2002/0053509 A1 * | 5/2002 | Hanson et al. | 204/198 |
| 2005/0000110 A1 * | 1/2005 | Park et al. | 34/236 |
| 2007/0204572 A1 * | 9/2007 | Nakagiri et al. | 53/520 |
| 2008/0260503 A1 * | 10/2008 | Uratani et al. | 414/226.05 |

FOREIGN PATENT DOCUMENTS

| | | | |
|---|---|---|---|
| KR | 100674882 B1 * | 1/2007 |
| KR | 20090011382 | * | 2/2009 |
| KR | 20100001852 A | * | 1/2010 |

OTHER PUBLICATIONS

KR 20100001852 A—Machine Translation.*
KR100674882B1—Machine Translation, Jan. 2007.*
KR20090011382—Machine Translation, Feb. 2009.*
Office Action issued in corresponding Korean Patent Application No. 10-2010-0076573, mailed Jan. 28, 2013.

* cited by examiner

SUBSTRATE CLEANING/DRYING APPARATUS AND SUBSTRATE PROCESSING APPARATUS COMPRISING THE SAME, AND SUBSTRATE CLEANING/DRYING METHOD AND METHOD FOR MANUFACTURING DISPLAY PANEL

This application claims the benefit of Korea Patent Application No. 10-2010-0076573, filed on Aug. 9, 2010, the entire contents of which is incorporated herein by reference for all purposes as if fully set forth herein.

BACKGROUND

1. Field of the Invention

The present disclosure relates to a substrate processing apparatus, a substrate processing method, and a method for manufacturing a display panel through the use of the substrate processing apparatus. More particularly, the present disclosure relates to a substrate cleaning/drying apparatus capable of improving yield by decreasing a substrate transferring time, a substrate processing apparatus comprising the substrate cleaning/drying apparatus, a substrate cleaning/drying method using the substrate cleaning/drying apparatus, and a method for manufacturing a display panel through the use of substrate cleaning/drying apparatus.

2. Discussion of the Related Art

Generally, semiconductor devices, solar cells, and display devices are manufactured by several processing steps, whereby various facilities necessarily required for the respective processing steps should be maintained. In order to manufacture the semiconductor devices, solar cells, and display devices, there are the following necessary requirements: a large amount of cost, corresponding apparatuses for the facilities, a large space for maintenance of the facilities, etc.

Especially, a substrate cleaning/drying process for cleaning and drying a substrate (or semiconductor substrate) is necessarily carried out to remove remaining matters, particles, and contaminants made during the process of manufacturing the semiconductor devices, solar cells, and display devices.

A related art substrate cleaning/drying apparatus for the aforementioned substrate cleaning/drying process is formed in a dual-spaced structure with upper and lower parts.

In the lower part of the substrate cleaning/drying apparatus, there are a lower conveyor which conveys an externally-provided substrate in a horizontal direction; and a substrate processing unit which applies cleaning and drying processes to the conveyed substrate, wherein the substrate processing unit is installed on the lower conveyor.

In the upper part of the substrate cleaning/drying apparatus, there is an upper conveyor which unloads the substrate by conveying the substrate, which is cleaned and dried in the substrate processing unit, in the horizontal direction.

At one side of the lower and upper parts, there is a lift conveyor which moves upward and downward.

The lift conveyor conveys the substrate cleaned and dried in the lower part to the upper conveyor.

The related art substrate cleaning/drying apparatus conveys the substrate from the lower part to the upper part through the use of a lift conveyor. Such configuration may lower the yield corresponding to an amount of time consumed for moving up and down the lift conveyor. That is, in case of the related art substrate cleaning/drying apparatus, the substrate cleaning and drying process in the lower part has to be stopped until the lift conveyor is moved upward and moved back downward to its original position. Therefore, the yield is lowered due to a loss of tact time.

Meanwhile, a substrate processing apparatus for manufacturing the semiconductor devices, solar cells, and display devices may comprise a thin-film forming apparatus to form a predetermined thin film on the substrate which is treated by the aforementioned substrate cleaning/drying apparatus.

In the aforementioned substrate processing apparatus, the thin-film forming apparatus and the substrate cleaning/drying apparatus are installed separately. Thus, there may be an additional substrate conveying apparatus which loads the substrate treated by the aforementioned substrate cleaning/drying apparatus into a cassette, and then conveys the cassette to the thin-film forming apparatus.

However, the aforementioned substrate processing apparatus may cause the lowering of yield since the substrate conveying time is increased due to the aforementioned steps for loading the cleaned/dried substrate into the cassette, unloading the substrate from the cassette, and conveying the unloaded substrate to the thin-film forming apparatus. In addition, the substrate may be contaminated during the substrate conveying process.

Accordingly, the related art substrate cleaning/drying apparatus and the substrate processing apparatus comprising the same causes a lowering of the yield.

BRIEF SUMMARY

Accordingly, the present disclosure is directed to a substrate cleaning/drying apparatus, a substrate processing apparatus comprising the substrate cleaning/drying apparatus, a substrate cleaning/drying method using the substrate cleaning/drying apparatus, and a method for manufacturing a display panel through the use of substrate cleaning/drying apparatus that substantially obviates one or more problems due to limitations and disadvantages of the related art.

A substrate cleaning and drying apparatus includes a first substrate transfer unit operable to transfer a substrate in a horizontal direction at an upper part of a base frame, a second substrate transfer unit operable to receive the substrate from the first substrate transfer unit and transfer the substrate in a vertical direction, a third substrate transfer unit operable to receive the substrate from the second substrate transfer unit and transfer the substrate in a horizontal direction at a lower part of the base frame, and a substrate processing unit operable to receive the substrate from the third substrate transfer unit and perform a cleaning and drying process on the substrate to clean and dry the substrate. The second substrate transfer unit includes a plurality of first hand forks operable to support the substrate. The third substrate transfer unit includes a plurality of first roller frames disposed parallel to each other in a horizontal direction at a fixed interval so that the plurality of first hand forks may pass through the plurality of first roller frames in a vertical direction.

A substrate cleaning and drying method includes loading a substrate onto a first substrate transfer unit, transferring the first substrate transfer unit in a horizontal direction towards a second substrate transfer unit, positioning the first substrate at a vertical transfer position, wherein a plurality of first hand forks of the second substrate transfer unit is inserted between the substrate and the first substrate transfer unit, lifting the plurality of first hand forks to a predetermined height to transfer the substrate onto the plurality of first hand forks, and transferring the first substrate transfer unit in a horizontal direction away from the second substrate transfer unit.

The method further includes, when the first substrate transfer unit is transferred away from the second substrate transfer unit beyond a length of the plurality of first hand forks, transferring the plurality of first hand forks of the second transfer unit in a vertical direction to a first horizontal transfer position, where the plurality of first hand forks are lowered in a vertical direction by passing an interval between each of a plurality of first roller frames of a third substrate transfer unit and transferring the substrate onto the third substrate transfer unit. The method also includes transferring the third substrate transfer unit in a horizontal direction away from the second substrate transfer unit, transferring the plurality of first hand forks in a vertical direction to the first vertical transfer position, transferring the substrate to a substrate processing unit, and performing a substrate cleaning and drying process on the substrate at the substrate processing unit.

According to the method, each of the plurality of first roller frames of the third substrate transfer unit includes a first fork passing area for allowing the plurality of first hand forks to pass through at an end away from the substrate processing unit. Transferring the plurality of first hand forks in a vertical direction to the first vertical transfer position includes sliding the plurality of first hand forks in an original position in a direction perpendicular to the horizontal direction to avoid the plurality of first roller frames, transferring the plurality of first hand forks in a vertical direction to the first vertical transfer position, sliding the plurality of first hand forks to the original position.

A substrate processing apparatus includes a clean room, a port disposed in the clean room operable to load and unload a substrate, a thin-film forming apparatus disposed in the clean room operable to form a predetermined film on the substrate, and a substrate cleaning and drying apparatus disposed in the clean room. The substrate cleaning and drying apparatus includes a first substrate transfer unit operable to transfer the substrate in a horizontal direction at an upper part of a base frame, a second substrate transfer unit operable to receive the substrate from the first substrate transfer unit and transfer the substrate in a vertical direction, a third substrate transfer unit operable to receive the substrate from the second substrate transfer unit and transfer the substrate in a horizontal direction at a lower part of the base frame, and a substrate processing unit operable to receive the substrate from the third substrate transfer unit and perform a cleaning and drying process on the substrate to clean and dry the substrate. The second substrate transfer unit includes a plurality of first hand forks operable to support the substrate. The third substrate transfer unit includes a plurality of first roller frames disposed parallel to each other in a horizontal direction at a fixed interval so that the plurality of first hand forks may pass through the plurality of first roller frames in a vertical direction.

A substrate processing apparatus further includes a substrate conveying unit disposed in the clean room operable to receive the substrate from the port and conveying the received substrate to the substrate cleaning and drying apparatus, receive the substrate from the substrate cleaning and drying apparatus and conveying the substrate to the thin-film forming apparatus, and receive the substrate from the thin-film forming apparatus and conveying the received substrate to the port.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DRAWINGS AND THE PRESENTLY PREFERRED EMBODIMENTS

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, a substrate cleaning/drying apparatus according to the present disclosure, a substrate processing apparatus comprising the substrate cleaning/drying apparatus, a substrate cleaning/drying method using the substrate cleaning/ drying apparatus, and a method for manufacturing a display panel through the use of substrate cleaning/drying apparatus will be described with reference to the accompanying drawings.

Figure 1:
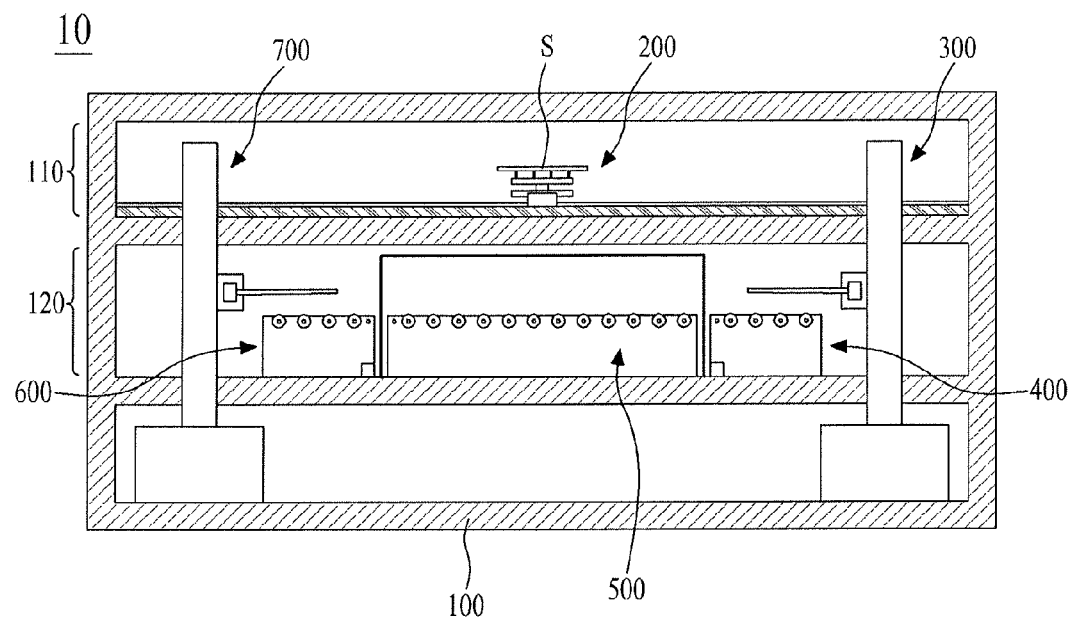
FIG. 1 is a cross section view illustrating a substrate cleaning/drying apparatus according to the embodiment of the present disclosure.
Figure 2:
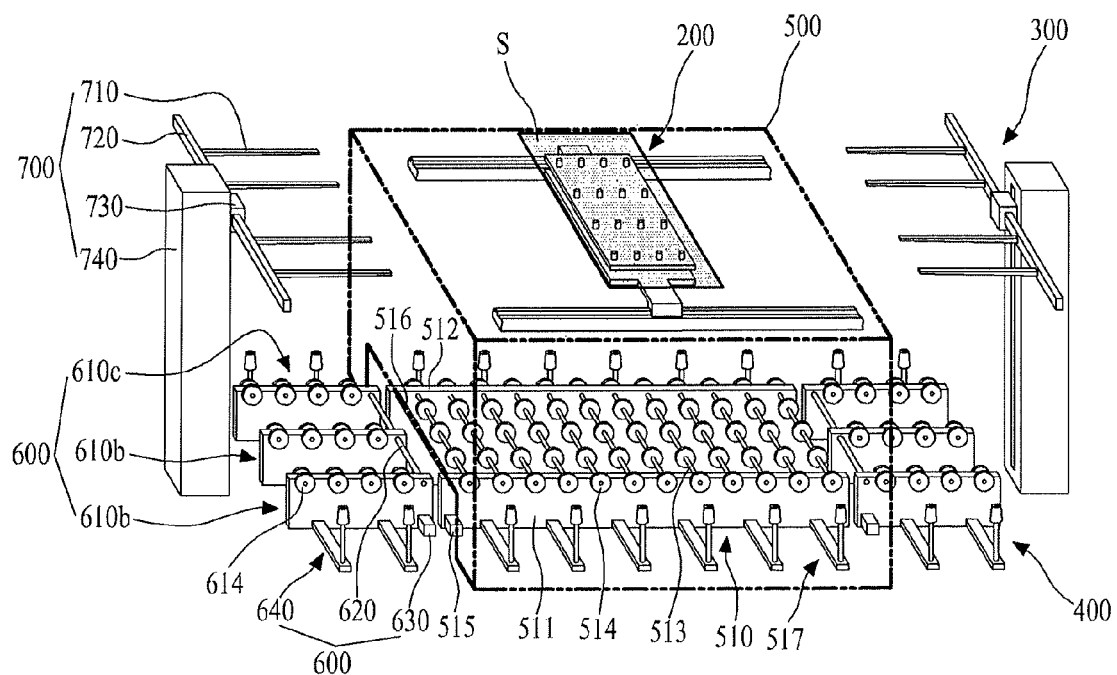
FIG. 2 is a perspective view illustrating the substrate cleaning/drying apparatus according to the embodiment of the present disclosure.

FIG. 1 is a cross section view illustrating a substrate cleaning/drying apparatus according to the embodiment of the present disclosure. FIG. 2 is a perspective view illustrating the substrate cleaning/drying apparatus according to the embodiment of the present disclosure.

Referring to FIGS. 1 and 2, the substrate cleaning/drying apparatus 10 according to the embodiment of the present disclosure includes a base frame 100; first, second, and third substrate transfer units 200, 300, and 400; a substrate processing unit 500; and fourth and fifth substrate transfer units 600 and 700.

The base frame 100 is divided into an upper part 110 and a lower part 120.

The first substrate transfer unit 200 is installed in the upper part 110 of the base frame 100; and the second substrate transfer unit 300, substrate processing unit 500, and fourth substrate transfer unit 600 are installed in the lower part 120 of the base frame 100. Meanwhile, a substrate entrance (not shown) is provided at the center of the upper part 110, through which a substrate may be loaded into or unloaded from the base frame 100.

The third substrate transfer unit 400 is installed at one side of the lower part 120; and the fifth substrate transfer unit 700 is installed at the other side of the upper and lower parts 110 and 120.

Figure 3A:
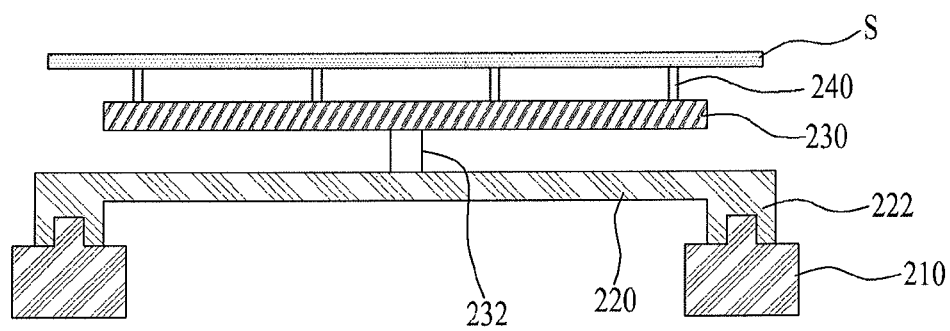
FIGS. 3A and 3B illustrate a first substrate transfer unit shown in FIGS. 1 and 2.

The first substrate transfer unit 200 is installed in the upper part 110 of the base frame 100, wherein the first substrate transfer unit 200 is movably provided in a horizontal direction. The first substrate transfer unit 200 transfers a substrate loaded through the substrate entrance in the horizontal direction to supply the substrate to the second substrate transfer unit 300. The first substrate transfer unit 200 also receives a substrate transferred in a vertical direction by the fifth substrate transfer unit 700; and transfers the received substrate towards the substrate entrance to unload the substrate from the base frame 100 to the exterior. As shown in FIG. 3A, the first substrate transfer unit 200 comprises a pair of rails 210, a transfer frame 220, a support plate 230, and a plurality of support pins 240.

The pair of rails 210 are installed in the upper part 110 of the base frame 100, wherein the rails 210 are provided at fixed intervals in parallel to the horizontal direction. The pair of rails guides the horizontal transfer of the transfer frame 220.

The transfer frame 220 is movably installed on the pair of rails 210, whereby the transfer frame 220 is transferred in the horizontal direction according to the guide of the pair of rails 210. Transfer blocks 222 are provided at both ends of the transfer frame 220, wherein the transfer blocks 222 are provided on, and movably connected to, the pair of rails 210. The transfer blocks 222 and rails 210 constitute an LM guider module, and enables the transfer of the transfer frame 220 in the horizontal direction.

The support plate 230 is installed on the transfer frame 220, to support the substrate. In this case, the support plate 230 is supported by a support axis 232 installed on the transfer frame 220.

The plurality of support pins 240 are installed with a predetermined height on the support plate 230, and are provided in a lattice-shaped pattern, to support the substrate.

Figure 3B:
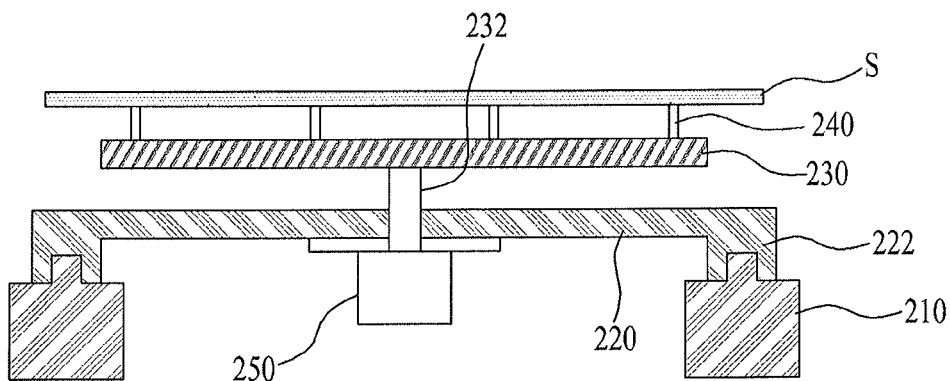

As shown in FIG. 3B, the first substrate transfer unit 200 may further comprise a substrate rotation unit 250.

While being in contact with the support axis 232, the substrate rotation unit 250 is installed under the transfer frame 220. The substrate rotation unit 250 may be, for example, a driving motor. The substrate rotation unit 250 rotates the support axis 232 by a predetermined angle, for example, about 90° or about 180°, so that the substrate supported by the plurality of support pins 240 is rotated by about 90° or about 180°. The reason for substrate rotation is to check a defect-occurring point, if the substrate is defective. In more detail, if the substrate loaded through the substrate entrance has a defective portion after completing the cleaning and drying processes in the substrate processing unit 500, the defect-occurring point should be checked so as to determine whether the defective portion of the substrate occurred during the cleaning and drying process, or occurred before the loading process. That is, when the substrate-loading direction is fixed, it is impossible to detect the defect-occurring point. However, if the cleaning and drying processes are carried out after rotating the substrate by the predetermined angle, it is possible to detect the defect-occurring point.

Figure 4:
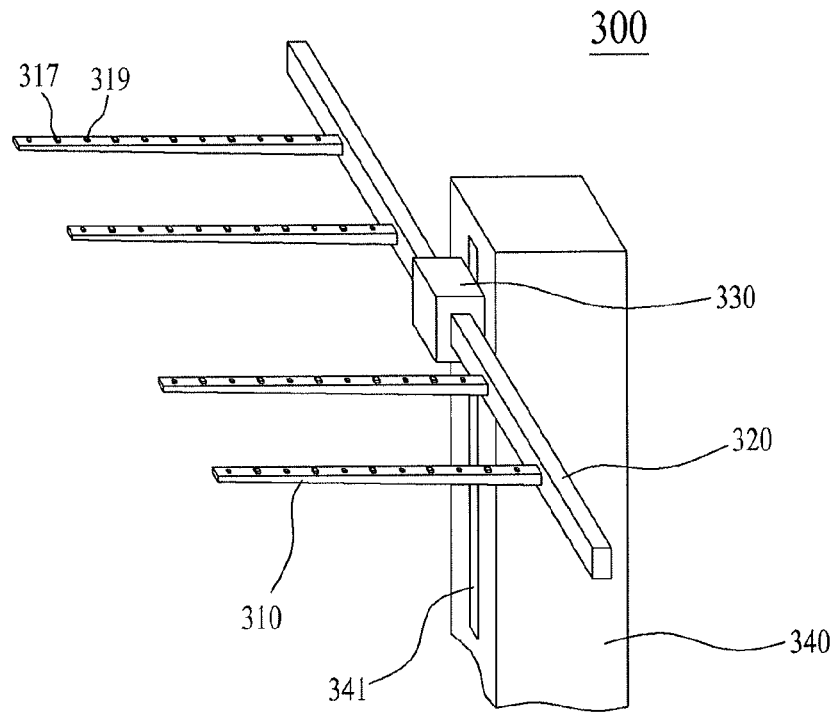
FIG. 4 illustrates a second substrate transfer unit shown in FIG. 2.

In FIGS. 1 and 2, the second substrate transfer unit 300 changes the transferring direction of the substrate (S), and supplies the substrate (S) to the third substrate transfer unit 400. That is, the second substrate transfer unit 300 transfers the substrate (S) transferred in the horizontal direction by the first substrate transfer unit 200 in the vertical direction through the use of a plurality of first hand forks 310 as shown in FIG. 4. The second substrate transfer unit 300 then supplies the substrate (S) transferred in the vertical direction to the third substrate transfer unit 400. The second substrate transfer unit 300 comprises the plurality of first hand forks 310, a first fork support bar 320, a first fork frame 330, and a first lift 340.

The plurality of first hand forks 310 are provided at fixed intervals and supports the rear surface of the substrate (S), wherein each first hand fork 310 is formed in a cantilever shape. In order to prevent the plurality of first hand forks 310 from bending downward due to the load of substrate (S), each of the plurality of first hand forks 310 is formed in such a way that its rear surface is sloped. That is, a thickness in each of the plurality of first hand forks 310 is gradually decreased from one end to the other end.

Meanwhile, each first hand fork 310 may be provided with a plurality of bending-prevention members 317 and a plurality of sensors 319, wherein the bending-prevention members 317 prevent the substrate (S) from bending downward, and the plurality of sensors 319 sense whether or not the substrate (S) is supplied onto the first hand fork 310. The bending-prevention members 317 may be formed of a plurality of blocks, pins, or pads installed at fixed intervals on the upper surface of the first hand fork 310. Also, the sensors 319 may be installed between each bending-prevention member 317.

The first fork support bar 320 supports one end of each of the plurality of first hand forks 310. Thus, the plurality of first hand forks 310, provided at fixed intervals in parallel to the horizontal direction, is supported by the first fork support bar 320.

The first fork frame 330 supports the center of lateral side or rear side of the first fork support bar 320. The first fork frame 330 and first fork support bar 320 may be formed as one body.

The first lift 340 is installed to be adjacent to the center of the front side of the third substrate transfer unit 400, to lift the first fork frame 330 in the vertical direction. For this, the first lift 340 comprises a ball screw module (not shown) or an LM guider module (not shown) for lifting the first fork frame 330.

The ball screw module comprises a ball screw axis (not shown), a rotation motor (not shown), a frame-lifting hole 341, and a ball screw nut (not shown).

The ball screw axis is vertically installed to be supported by a plurality of brackets (not shown), whereby the ball screw axis rotates according to a rotation of the rotation motor (not shown).

The frame-lifting hole 341 is formed on the inner surface of the first lift 340, and the first fork frame 330 is lifted through the frame-lifting hole 341.

The ball screw nut is formed on the inner surface of the first fork frame 300, and is provided to be in contact with the ball screw axis through the frame-lifting hole 341.

The first lift 340 including the ball screw module lifts the ball screw nut by rotating the ball screw axis through the rotation motor to lift the first fork frame 330.

Also, the LM guider module may comprise an LM guider rail (not shown) and an LM guider block (not shown).

The LM guider rail is provided vertical to the inner surface of the first lift 340.

The LM guide block is provided on the inner surface of the first fork frame 330, and is also movably connected to the LM guider rail.

The first lift 340 including the LM guider module transfers the LM guide block along the LM guider rail to lift the first fork frame 330.

The aforementioned description describes one first lift 340, but the disclosure is not limited to one. If the substrate (S) is large-sized, a plurality of first lifts may be provided so as to lift the first fork support bar 320 at a plurality of positions at the same time.

Figure 5:
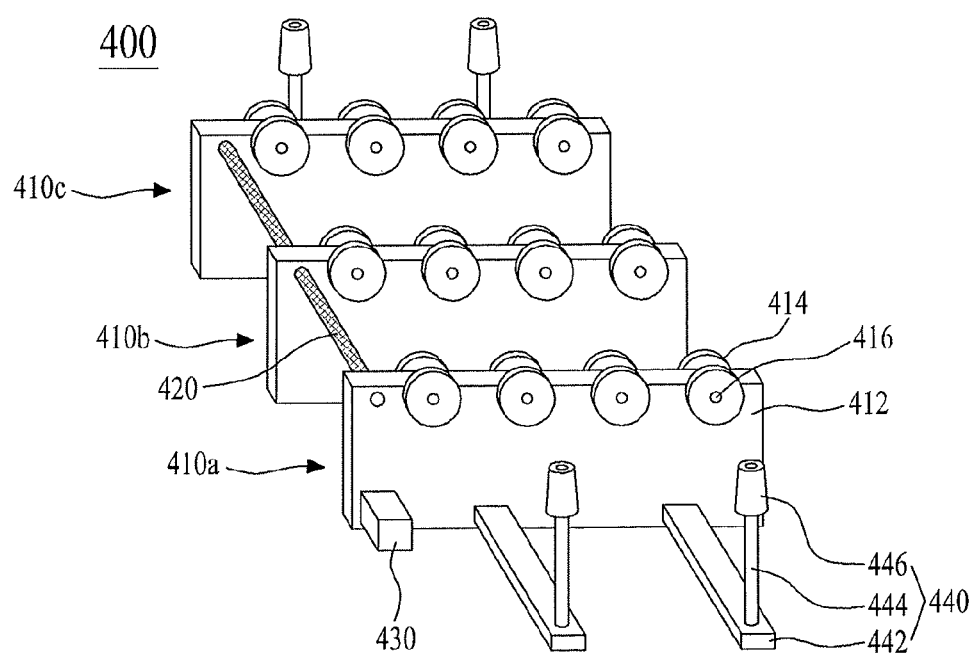
FIG. 5 illustrates a third substrate transfer unit shown in FIG. 2.

In FIGS. 1 and 2, the third substrate transfer unit 400 receives the substrate (S) transferred in the vertical direction from the second substrate transfer unit 300; transfers the received substrate (S) in the horizontal direction; and supplies the substrate to the substrate processing unit 500. As shown in FIG. 5, the third substrate transfer unit 400 comprises a plurality of first roller frames 410a, 410b, and 410c; a first shaft 420; a first shaft rotation member 430; and a first rotation transmission member (not shown).

The plurality of first roller frames 410a, 410b, and 410c transfer the substrate (S) supplied from the second substrate transfer unit 300 in the horizontal direction, and supplies the received substrate (S) to the substrate processing unit 500. Each of the plurality of first roller frames 410a, 410b, and 410c comprises a first support frame 412, and a plurality of first rollers 414.

The respective first support frames 412 are installed parallel to each other in the horizontal direction, and are provided to be adjacent to one side of the substrate processing unit 500, that is, the front side. The first support frames 412 are provided at fixed intervals so that the plurality of first hand forks 310 may be lifted through the intervals among the first support frames 412. That is, since the first support frames 412 are provided at fixed intervals, they do not obstruct the movement track of the plurality of first hand forks 310 being lowered to transfer the substrate (S) in the vertical direction.

The respective first support frames 412 have the different heights so that the substrate (S) placed onto the plurality of first rollers 414 is tilted at a predetermined angle, for example, about 5°.

The plurality of first rollers 414 are installed at one side or both sides of each first support frame 412, wherein the plurality of first rollers 414 are provided at fixed intervals along the longitudinal direction of the first support frame 412. Preferably, the plurality of first rollers 414 are installed at both sides of each first support frame 412. In this case, the first rollers 414 are provided at both sides of each roller driving axis 416 penetrating the first support frame 412.

The first shaft 420 is installed to penetrate the other side which is away from the second substrate transfer unit of each first support frame 412, wherein the other side of the first support frame 412 is positioned adjacent to the substrate processing unit 500.

The first shaft rotation member 430 may be a driving motor. The first shaft rotation member 430 is installed in the outer-positioned first support frame 412 among the plurality of first support frames 412, so that the first shaft rotation member 430 rotates the first shaft 420. At this time, rotation force of the first shaft rotation member 430 may be transmitted to the first shaft 420 through a belt, a chain, or a plurality of gears (not shown).

The first rotation transmission member (not shown) is installed inside each first support frame 412, so that a rotation force of the first shaft 420 is transmitted to the plurality of first rollers 414. The rotation force of the first shaft 420 may be transmitted to the plurality of first rollers 414 installed in each of the first support frames 412 through a belt, a chain, or a plurality of gears (not shown).

The third substrate transfer unit 400 may further comprise a plurality of first convey guide units 440.

The plurality of first convey guide units 440 are installed in the outer-positioned first roller frames 410a and 410c among the plurality of first roller frames 410a, 410b, and 410c, to guide the substrate (S) transferred in the horizontal direction by the plurality of first rollers 414. Each of the plurality of first convey guide units 440 comprises a guide plate 442, a guide bar 444, and a guide roller 446.

The guide plate 442 is installed to have a predetermined length at the outer surface of the first support frame 412.

The guide bar 444 is vertically installed on the guide plate 442 corresponding to one side of the substrate (S).

The guide roller 446 is rotatably installed in an upper portion of the guide bar 444, whereby the guide roller 446 guides the horizontal transfer of the substrate (S) while being in contact with the lateral side of the substrate (S).

In FIGS. 1 and 2, the substrate processing unit 500 transfers the substrate (S) supplied from the third substrate transfer unit 400 in the horizontal direction, and simultaneously applies the cleaning and drying process to the transferred substrate (S), to clean the substrate (S). The substrate processing unit 500 comprises a roller conveyor 510, a cleaning unit (not shown), and a drying unit (not shown).

The roller conveyor 510 transfers the substrate (S) supplied from the third substrate transfer unit 400 in the horizontal direction through the use of a plurality of roller driving axes 513. The roller driving axes 513 are rotatably installed between first and second conveyor frames 511 and 512 and are provided at fixed intervals in a direction perpendicular to the horizontal direction. A plurality of convey rollers 514 are installed at fixed intervals in each of the plurality of roller driving axes 513. The plurality of roller driving axes 513 are in communication with a driving motor 515 installed at one side of the first conveyor frame 511, whereby the plurality of roller driving axes 513 rotates together with the rotation of the driving motor 515. Rotation force of the driving motor 515 is transmitted to the plurality of roller driving axes 513 through a driving shaft 516 installed at one side of the first and second conveyor frames 511 and 512.

A plurality of guide rollers 517 may be installed at the outer sides of the first and second conveyor frames 511 and 512 so as to guide the horizontal transfer of the substrate (S) transferred in the horizontal direction by the plurality of convey rollers 514. The plurality of guide rollers 517 are identical in structure to the aforementioned first convey guide units 440 of the third substrate transfer unit 400. Therefore, a detailed explanation for the structure of the guide roller 517 will be omitted.

The roller conveyor 510 is identical in structure to the aforementioned third substrate transfer unit 400, so that the roller conveyor 510 can transfer the substrate (S) in the horizontal direction.

The cleaning unit (not shown) comprises first, second, and third cleaning modules (not shown) installed in sequence.

The first cleaning module cleans the substrate (S) by removing organic foreign matters therefrom. The first cleaning module removes the organic foreign matters from the substrate (S) through the use of atmospheric pressure plasma.

The second cleaning module sprays deionized water (DI) onto the substrate (S) from which the organic foreign matters have been removed, and also firstly cleans the substrate (S) through the use of a brush roller (not shown). At this time, an air spraying nozzle may be installed at an end of the second cleaning module so as to remove the deionized water (DI) from the substrate (S) through the use of air.

The third cleaning module sprays deionized water (DI) onto the firstly-cleaned substrate (S) to secondarily clean the substrate (S). An air spraying nozzle may be installed at an end of the third cleaning module so as to remove the deionized water (DI) from the substrate (S) through the use of air.

The drying unit (not shown) dries the substrate (S) cleaned in the cleaning unit (not shown). The drying unit may dry the substrate (S) through the use of an air knife installed at lower and upper sides of the substrate (S).

The fourth substrate transfer unit 600 is installed to be adjacent to the rear side of the substrate processing unit 500 so as to transfer the substrate (S) discharged from the substrate processing unit 500 in the horizontal direction. The fourth substrate transfer unit 600 comprises a plurality of second roller frames 610*a*, 610*b*, and 610*c*; a second shaft 620; a second shaft rotation member 630; a first rotation transmission member (not shown); and a plurality of second convey guide units 640. Except that the fourth substrate transfer unit 600 is installed adjacent to the rear side of the substrate processing unit 500 to be symmetrical to the aforementioned third substrate transfer unit 400, the fourth substrate transfer unit 600 is identical in structure to the aforementioned third substrate transfer unit 400, even though they have the different reference numerals. Therefore, a detailed explanation for the fourth substrate transfer unit 600 will be omitted.

The fifth substrate transfer unit 700 transfers the substrate (S) in the horizontal direction by the fourth substrate transfer unit 600 in the vertical direction. The fifth substrate transfer unit 700 then supplies the substrate to the first substrate transfer unit 200. The fifth substrate transfer unit 700 comprises a plurality of second hand forks 710, a second fork support bar 720, a second fork frame 730, and a second lift 740. Except that the fifth substrate transfer unit 700 is installed adjacent to the rear side of the fourth substrate transfer unit 600 to be symmetric to the aforementioned second substrate transfer unit 300, the fifth substrate transfer unit 700 is identical in structure to the aforementioned second substrate transfer unit 300, even though they have the different reference numerals. Therefore, a detailed explanation for the fifth substrate transfer unit 700 will be omitted.

The plurality of second lifts 740 may be provided so as to lift the first fork support bar 720 at a plurality of positions at the same time.

Figure 6:
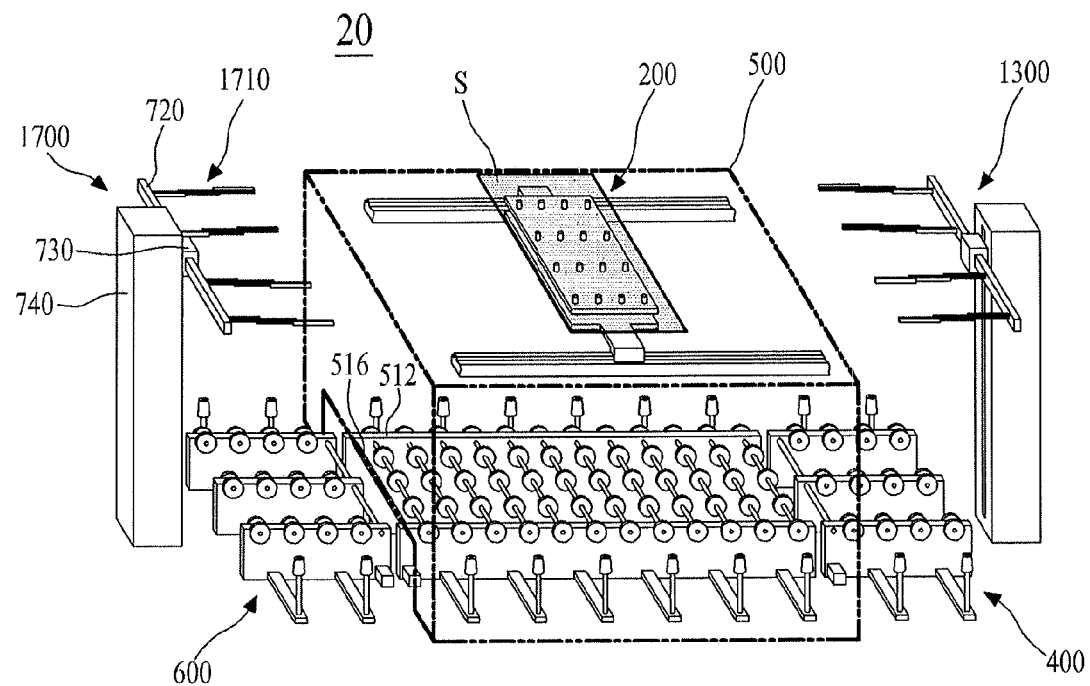
FIG. 6 illustrates a substrate cleaning/drying apparatus according to the second embodiment of the present disclosure.

FIG. 6 illustrates a substrate cleaning/drying apparatus according to the second embodiment of the present disclosure.

Referring to FIG. 6, the substrate cleaning/drying apparatus 20 according to the second embodiment of the present disclosure includes a base frame 100; first, second, and third substrate transfer units 200, 1300, and 400; a substrate processing unit 500; and fourth and fifth substrate transfer units 600 and 1700. Except for the second and fifth substrate transfer units 1300 and 1700, the substrate cleaning/drying apparatus 20 according to the second embodiment of the present disclosure is identical in structure to the substrate cleaning/drying apparatus 10 according to the first embodiment of the present disclosure. Therefore, a detailed explanation for the same parts will be omitted, and the same reference numerals will be used so as to refer to the same parts.

Figure 7:
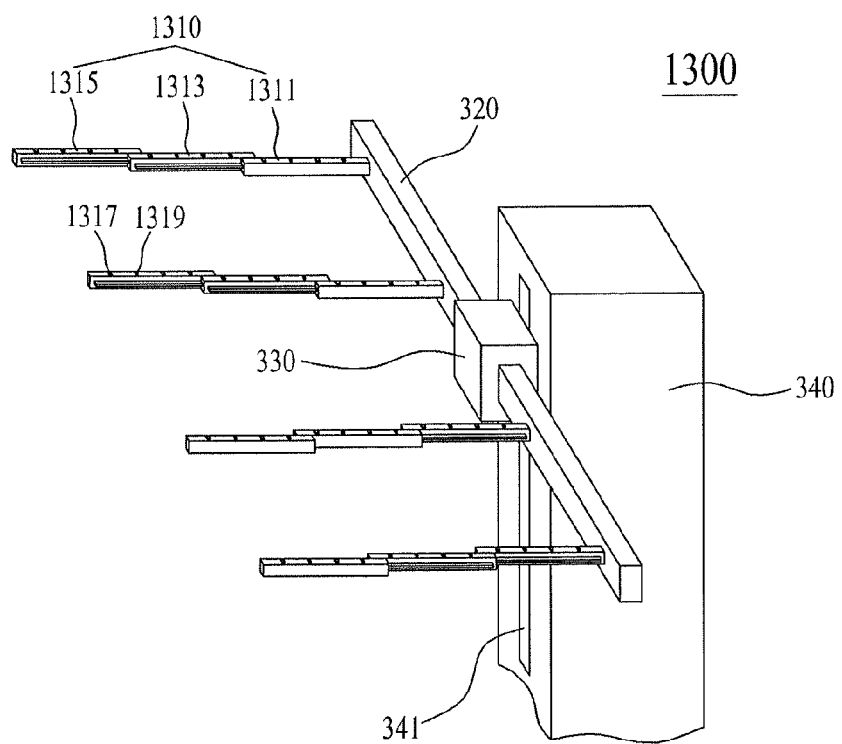
FIG. 7 illustrates a second substrate transfer unit shown in FIG. 2.

The second substrate transfer unit 1300 transfers the substrate (S) supplied from the first substrate transfer unit 200 in the horizontal direction by lifting a plurality of foldable first hand forks 1310, and supplies the substrate (S) to the third substrate transfer unit 400. Then, the plurality of first hand forks 1310 unfolded are folded in the horizontal direction, and are lifted and restored to a first vertical transfer position without disturbing the substrate (S) supplied to the third substrate transfer unit 400. For this, as shown in FIG. 7, the second substrate transfer unit 1300 comprises the plurality of first hand forks 1310, a first fork support bar 320, a first fork frame 330, and a first lift 340. Except the plurality of first hand forks 1310, the second substrate transfer unit 1300 in the substrate cleaning/drying apparatus 20 according to the second embodiment of the present disclosure is identical in structure to the aforementioned second substrate transfer unit 300 in the substrate cleaning/drying apparatus 10 according to the first embodiment of the present disclosure, whereby a detailed explanation for the second substrate transfer unit 1300 will be omitted.

As shown in FIG. 7, each of the plurality of first hand forks 1310 comprises first to third sliding bars 1311, 1313, and 1315 which are operable to be folded.

The first sliding bar 1311 is installed at the first fork support bar 320, wherein a longitudinal direction of the first sliding bar 1311 is provided in parallel to the horizontal direction. At this time, a first LM guider rail is formed at one side of the first sliding bar 1311. On an upper side of the first sliding bar 1311, there are a plurality of bending-prevention members 1317 and a plurality of sensors 1319, wherein the bending-prevention members 1317 prevent the substrate (S) from bending downward, and the sensors 1319 sense whether or not the substrate (S) is supplied on the first hand forks. At this time, the bending-prevention members 1317 may be formed of a plurality of blocks, pins, or pads installed at fixed intervals on the upper surface of the first sliding bar 1311. Also, the sensors 1319 may be installed between each of the bending-prevention members 1317.

The second sliding bar 1313 is installed at the first LM guider rail of the first sliding bar 1311, wherein a longitudinal direction of the second sliding bar 1313 is provided in parallel to the horizontal direction. A first LM guider block to be connected to the first LM guider rail is formed at one side of the second sliding bar 1313. Accordingly, the second sliding bar 1313 slides in the horizontal direction according to the guide of the first guider rail by the driving of first LM guider module comprising the first guider rail and the first guider block.

At the other side of the second sliding bar 1313, a second LM guider block is formed. Also, the aforementioned bending-prevention members 1317 and sensors 1319 may be installed at the upper side of the second sliding bar 1313.

The third sliding bar 1315 is installed at the second LM guider block of the second sliding bar 1313, wherein a longitudinal direction of the third sliding bar 1315 is provided in parallel to the horizontal direction. A second LM guider rail is formed at one side of the third sliding bar 1315. Accordingly, the third sliding bar 1315 slides in the horizontal direction according to the guide of the second guider rail by the driving of second LM guider module comprising the second guider rail and the second guider block.

The aforementioned bending-prevention members 1317 and sensors 1319 may be installed at the upper side of the third sliding bar 1315.

The second and third sliding bars 1313 and 1315 included in each of the plurality of first hand forks 1310 may slide to be stretched to a substrate-support position, or may slide to be folded to a substrate-avoidance position, according to the simultaneous driving of the first and second LM guider modules.

In the aforementioned description, each of the plurality of first hand forks 1310 is provided with the first to third sliding bars 1311, 1313, and 1315. However, the disclosure is not limited to the aforementioned description. Based on the size of the substrate (S) and/or the length of the sliding bar, the number of sliding bars to be included in each first hand fork 1310 may be the three or more.

The fifth substrate transfer unit 1700 transfers the substrate (S)transferred in the horizontal direction by the fourth substrate transfer unit 600 in the vertical direction, The fifth substrate transfer unit 1700 then supplies the substrate (S) transferred in the vertical direction to the first substrate transfer unit 200. The fifth substrate transfer unit 1700 comprises a plurality of second hand forks 1710, a second fork support bar 720, a second fork frame 730, and a second lift 740. Except that the fifth substrate transfer unit 1700 is installed adjacent to the rear sides of the fourth substrate transfer unit 600 to be symmetric to the aforementioned second substrate transfer unit 1300, the fifth substrate transfer unit 1700 is identical in structure to the aforementioned second substrate transfer unit 1300, even though they have the different reference numerals. Therefore, a detailed explanation for the fifth substrate transfer unit 1700 will be omitted.

The substrate cleaning/drying apparatus 20 according to the second embodiment of the present disclosure supplies the substrate (S) placed on the sliding bars 1311, 1313, and 1315 of the second substrate transfer unit 1300 to the third substrate transfer unit 400. The sliding bars 1311, 1313 and 1315 immediately folds the sliding bars to the substrate-avoidance position, and lifts the plurality of first hand forks 1310 without disturbing the substrate (S).

Also, the substrate cleaning/drying apparatus 20 according to the second embodiment of the present disclosure supplies the substrate (S) placed on the sliding bars of the fifth substrate transfer unit 1700 to the first substrate transfer unit 200. The sliding bars immediately folds to the substrate-avoidance position, and lowers the plurality of second hand forks 1710 without disturbing the substrate (S).

Figure 8:
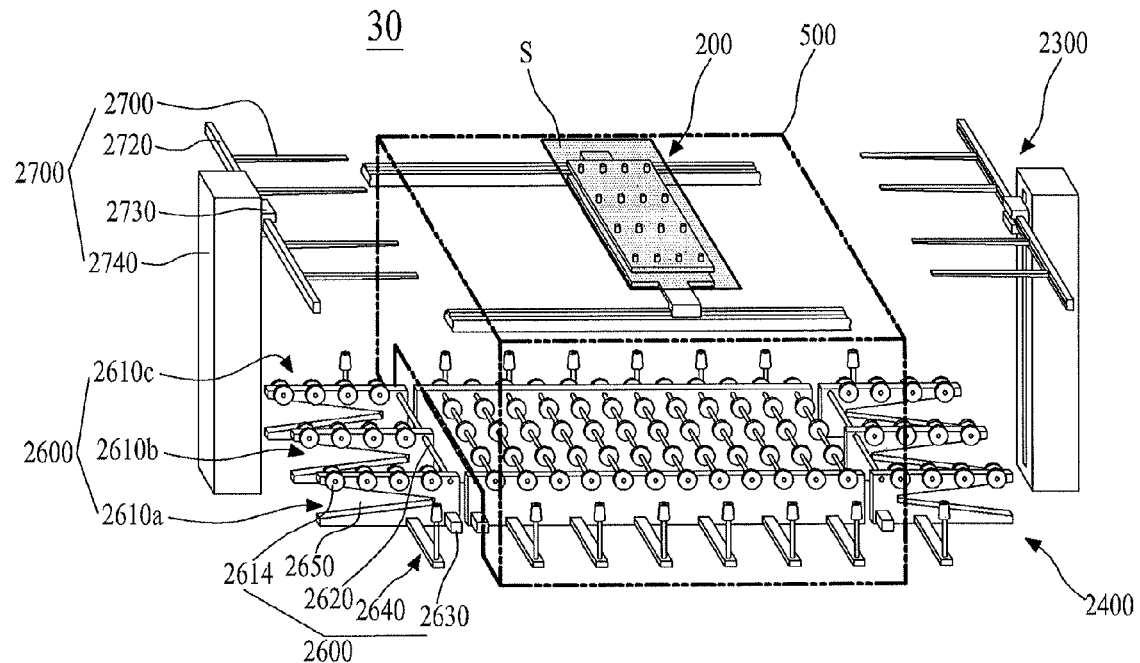
FIG. 8 illustrates a substrate cleaning/drying apparatus according to the third embodiment of the present disclosure.

FIG. 8 illustrates a substrate cleaning/drying apparatus according to the third embodiment of the present disclosure.

Referring to FIG. 8, the substrate cleaning/drying apparatus 30 according to the third embodiment of the present disclosure includes a base frame 100; first, second, and third substrate transfer units 200, 2300, and 2400; a substrate processing unit 500; and fourth and fifth substrate transfer units 2600 and 2700. Except for the second to fifth substrate transfer units 2300, 2400, 2600, and 2700, the substrate cleaning/drying apparatus 30 according to the third embodiment of the present disclosure is identical in structure to the aforementioned substrate cleaning/drying apparatus 10 according to the first embodiment of the present disclosure. Therefore, a detailed explanation for the same parts will be omitted, and the same reference numerals will be used so as to refer to the same parts.

Figure 9:
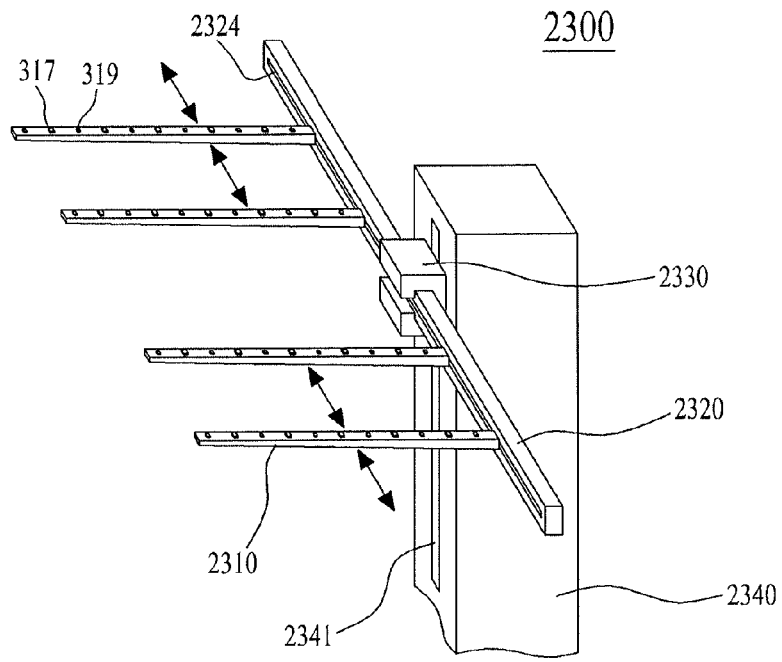
FIG. 9 illustrates a second substrate transfer unit shown in FIG. 8.

The second substrate transfer unit 2300 transfers the substrate (S) supplied from the first substrate transfer unit 200 by transferring a plurality of first hand forks 2310 in the vertical direction. The second substrate then supplies the substrate (S) to the third substrate transfer unit 2400. Then, the plurality of first hand forks 2310 symmetrically slide in the direction of both sides of a first fork frame 2330 of the second substrate transfer unit 2300. The plurality of first hand forks 2310 are then lifted and restored to a first vertical transfer position without disturbing the substrate (S) supplied to the third substrate transfer unit 2400. As shown in FIG. 9, the second substrate transfer unit 2300 comprises a plurality of first hand forks 2310, a first fork support bar 2320, the first fork frame 2330, and a first lift 2340.

The first hand forks 2310 are provided at fixed intervals, wherein each first hand fork 2310 is formed in a cantilever shape to support the rear surface of the substrate (S). In order to prevent the plurality of first hand forks 2310 from bending downward due to the load of substrate (S), each of the plurality of first hand forks 2310 is formed in such a way that its rear surface is sloped. That is, a thickness in each of the plurality of first hand forks 2310 is gradually decreased from one end to the other end. On an upper side of each of the plurality of first hand forks 2310, there are a plurality of bending-prevention members 317 and a plurality of sensors 319.

Each of the plurality of first hand forks 2310 is supported by the first fork support bar 2320, and each of the plurality of first hand forks 2310 slides along a longitudinal direction of the first fork support bar 2320.

Figure 10:
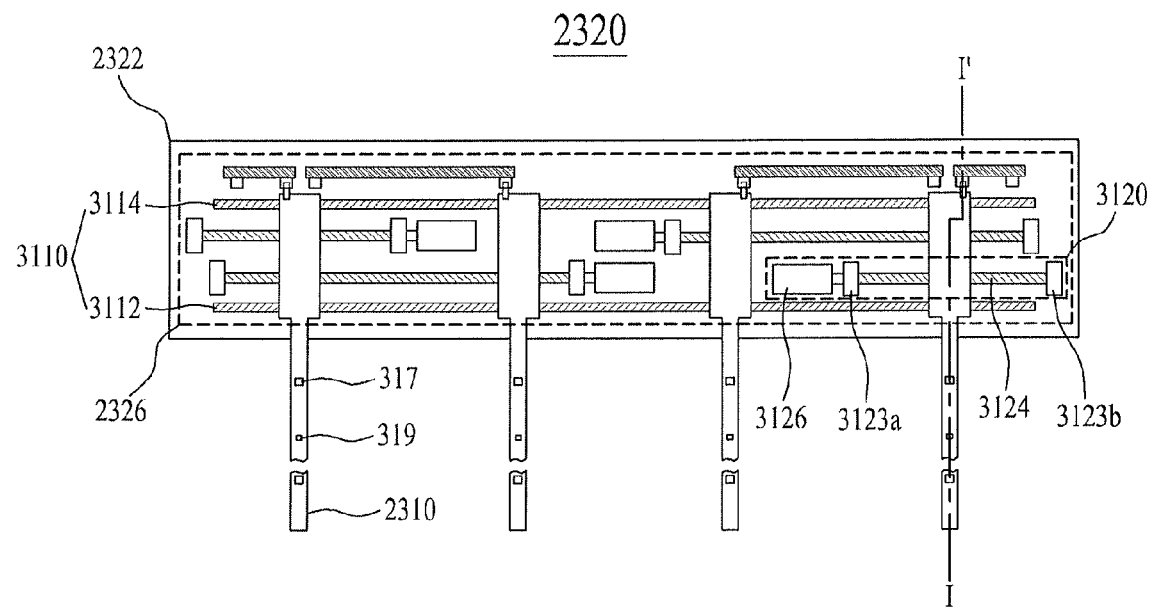
FIG. 10 illustrates a first fork support bar shown in FIG. 9.
Figure 11:
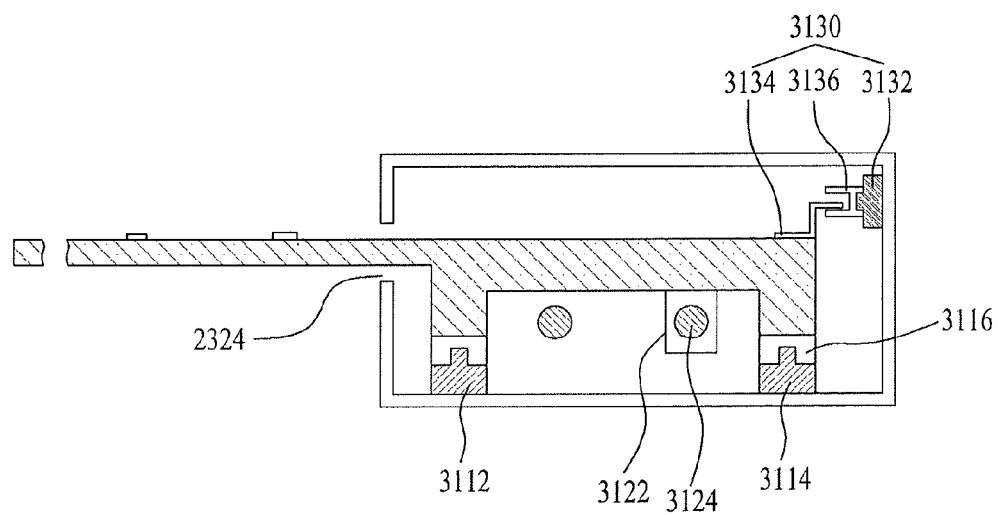
FIG. 11 is a cross section view along I-I' of FIG. 10.

The first fork support bar 2320 supports one end of each of the plurality of first hand forks 2310, and also allows the plurality of first hand forks 2310 to slide toward its both ends along its longitudinal direction. As shown in FIGS. 10 and 11, the first fork support bar 2320 comprises a bar frame 2322, a sliding slit 2324 (See FIG. 9), and a fork sliding module 2326.

The bar frame 2322 is formed in a rectangular shape and is supported by the first fork frame 2330.

The sliding slit 2324 is formed along the longitudinal direction at one side of the bar frame 2322 so that the plurality of first hand forks 2320 may slide along the sliding slit 2324.

The fork sliding module 2326 comprises a sliding guide unit 3110, a plurality of ball screw units 3120, and a sliding sensor unit 3130.

The sliding guide unit 3110 is installed at each of the plurality of first hand forks 2310, and is also installed at the bar frame 2322 to guide the sliding of each of the plurality of first hand forks 2310. The sliding guide unit 3110 comprises first and second sliding rails 3112 and 3114, and a plurality of sliding blocks 3116.

The first and second sliding rails 3112 and 3114 are provided at fixed intervals, and are formed in parallel to the longitudinal direction of the bar frame 2322. Also, the first and second sliding rails 3112 and 3114 are installed at the bottom of the bar frame 2322.

The plurality of sliding blocks 3116 are installed at one side of the first hand fork 2310 on the bottom surface in each of the plurality of first hand forks 2310, and are slidably connected to the first and second sliding rails 3112 and 3114. One side of each of the plurality of first hand forks 2310 is formed in a shape of "∩", and the pair of sliding blocks 3116 are installed at the lower portions of the both sidewalls of the shape "∩".

The plurality of ball screw units 3120 allow the plurality of first hand forks 2310 slide in the horizontal direction along the first and second sliding rails 3112 and 3114. The plurality of ball screw units 3120 are installed inside the bar frame 2322 while corresponding to the respective first hand forks 2310 between the first and second sliding rails 3112 and 3114. As shown in FIG. 10, if the number of first hand forks 2310 is four, the number of ball screw units 3120 is also four.

Each of the plurality of ball screw units 3120 comprises a ball screw nut 3122, a ball screw axis 3124, and a driving motor 3126.

The ball screw nut 3122 is installed at one side of the first hand fork 2310 formed in shape of "∩".

The ball screw axis 3124 is installed between the first and second sliding rails 3112 and 3114 while being in contact with the ball screw nut 3122. At this time, one side and the other side in each of the plurality of ball screw axes 3124 are rotatably supported by a pair of axis supporters 3123*a* and 3123*b* installed at the bottom of the bar frame 2322.

The driving motor 3126 is installed at the bottom of the bar frame 2322, and is supported by a motor bracket. The driving motor 3126 is further connected to the ball screw axis 3124. At this time, a coupling may be installed between a rotation axis of the driving motor 3126 and the ball screw axis 3124, wherein the coupling transmits rotation force of the driving motor 3126 to the ball screw axis 3124.

Each of the plurality of ball screw units 3120 rotates the ball screw axis 3124 so as to linearly move the ball screw nut 3122, whereby the corresponding first hand fork 2310 slides.

In FIGS. 10 and 11, the sliding sensor unit 3130 detects a sliding position of each of the plurality of first hand forks 2310 which slide leftward/rightward according to the driving of each of the plurality of ball screw units 3120. The sliding sensor unit 3130 also generates an electric signal so as to stop the driving of each of the plurality of ball screw units 3120. The sliding sensor unit 3130 comprises a sensor rail 3132, a plurality of sensor dogs 3134, and a plurality of position sensors 3136.

The sensor rail 3132 is installed at the inner surface of the bar frame 2322. The sensor rail 3132 may be installed while being divided into several parts to have a length corresponding to a sliding distance of each of the plurality of first hand forks 2310.

Each of the plurality of sensor dogs 3134 is installed at one side of each of the plurality of first hand forks 2310, where each sensor dog 3134 protrudes by a predetermined length toward the sensor rail 3132.

Each of the plurality of position sensors 3136 is installed on the sensor rail 3132, and is provided at a position corresponding to the leftward/rightward sliding distance of each of the plurality of first hand forks 2310 to detect a position of the sensor dog 3134. In other words, each of the plurality of position sensors 3136 detects the position of each sensor dog 3134 installed in each of the plurality of first hand forks 2310, and allows the plurality of ball screw units 3120 to slide leftward/rightward to be positioned at both sides of the bar frame 2322 or to be positioned in the substrate-support position at fixed intervals on the bar frame 2322.

In FIG. 9, the first fork frame 2330 supports the center of lateral side or rear side of the first fork support bar 2320. In this case, the first fork frame 2300 and first fork support bar 2320 may be formed as one body.

The first lift 2340 is installed to be adjacent to the center of the front side of the third substrate transfer unit 2400 to move the first fork frame 2330 in the vertical direction. The first lift 2340 comprises a ball screw module (not shown) or an LM guider module (not shown) for lifting the first fork frame 2330 through the frame-lifting hole 2341. This first lift 2340 is identical in structure to the aforementioned first lift 340 in the substrate cleaning/drying apparatus 10 according to the first embodiment of the present disclosure. Therefore, a detailed explanation for the first lift 2340 will be omitted.

Figure 12:
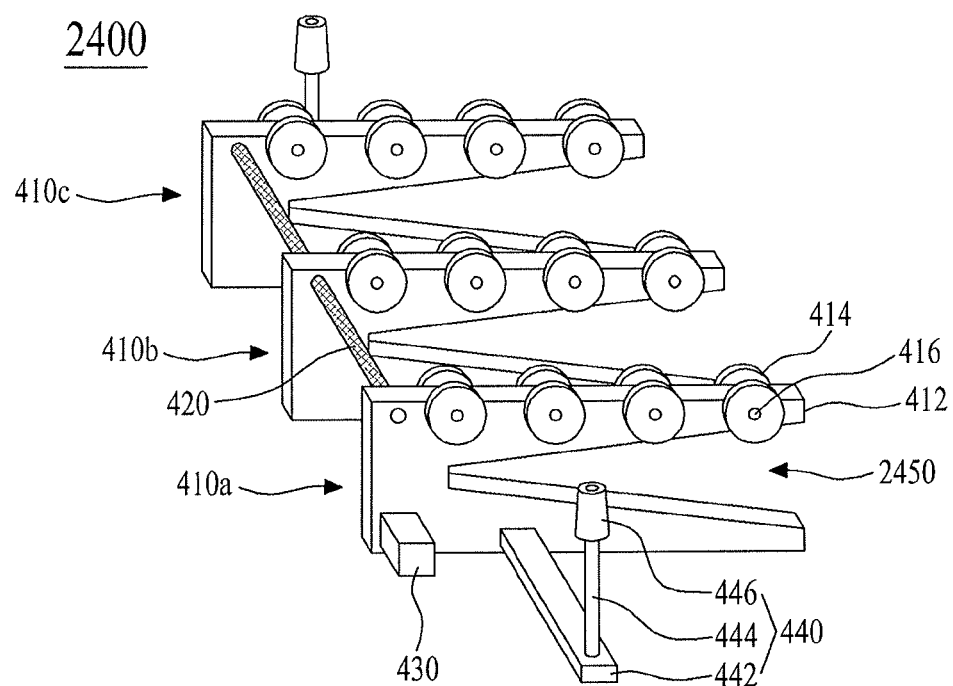
FIG. 12 illustrates a third substrate transfer unit shown in FIG. 8.

In FIG. 8, the third substrate transfer unit 2400 receives the substrate (S) transferred in the vertical direction from the second substrate transfer unit 2300, and transfers the received substrate (S) in the horizontal direction to supply the substrate (S) to the substrate processing unit 500. As shown in FIG. 12, the third substrate transfer unit 2400 comprises a plurality of first roller frames 410*a*, 410*b*, and 410*c*; a first shaft 420; a first shaft rotation member 430; a first rotation transmission member (not shown); a plurality of first convey guide units 440; and a fork passing area 2450. Except that the third substrate transfer unit 2400 includes the additionally-provided fork passing area 2450, the third substrate transfer unit 2400 is identical in structure to the aforementioned third substrate transfer unit 400 in the substrate cleaning/drying apparatus 10 according to the first embodiment of the present disclosure. Therefore, a detailed explanation for the third substrate transfer unit 2400 will be omitted.

The fork passing area 2450 is formed in a shape of "⊂" which is opened in the direction from a front side of each first support frame 412 adjacent to the second substrate transfer unit 2300 toward the other side of each first support frame 412. In other words, one side of each first support frame 412 is formed to have a cross-sectional shape of a "⊂". At this time, the fork passing area 2450 has such a length as to avoid a collision with the first hand forks 2310 when the first hand forks 2310 slide leftward/rightward.

In FIG. 8, the fourth substrate transfer unit 2600 is installed adjacent to the rear side of the substrate processing unit 500 so that the fourth substrate transfer unit 2600 transfers the substrate (S) discharged from the substrate processing unit 500 in the horizontal direction. The fourth substrate transfer unit 2600 comprises a plurality of second roller frames 2610*a*, 2610*b*, and 2610*c*; a second shaft 2620; a second shaft rotation member 2630; a first rotation transmission member (not shown); a plurality of second convey guide units 2640; and a fork passing area 2650. Except that the fourth substrate transfer unit 2600 is installed adjacent to the rear side of the substrate processing unit 500 to be symmetrical to the aforementioned third substrate transfer unit 2400, the fourth substrate transfer unit 2600 is identical in structure to the aforementioned third substrate transfer unit 2400, even though they have the different reference numerals. Therefore, a detailed explanation for the fourth substrate transfer unit 2600 will be omitted.

The fifth substrate transfer unit 2700 transfers the substrate (S) transferred in the horizontal direction by the fourth substrate transfer unit 2600 in the vertical direction. The fifth substrate transfer unit 2700 then supplies the substrate (S) transferred in the vertical direction to the first substrate transfer unit 200. The fifth substrate transfer unit 2700 comprises a plurality of second hand forks 2710, a second fork support bar 2720, a second fork frame 2730, and a second lift 2740. Except that the fifth substrate transfer unit 2700 is installed adjacent to the rear side of the fourth substrate transfer unit 2600 to be symmetrical to the aforementioned second substrate transfer unit 2300, the fifth substrate transfer unit 2700 is identical in structure to the aforementioned second substrate transfer unit 2300, even though they have the different reference numerals. Therefore, a detailed explanation for the fifth substrate transfer unit 2700 will be omitted. Also, the second fork support bar 2720 is identical in structure to the second fork support bar 2320 shown in FIGS. 10 and 11.

The substrate cleaning/drying apparatus 30 according to the third embodiment of the present disclosure supplies the substrate (S) placed onto the first hand forks 2310 of the second substrate transfer unit 2300 to the third substrate transfer unit 2400. The substrate cleaning/drying apparatus 30 allows the first hand forks 2310 to slide leftward/rightward to be positioned at both sides of the first fork support bar 2320, and lifts the first hand forks 2310 to avoid the substrate (S).

The substrate cleaning/drying apparatus 30 according to the third embodiment of the present disclosure supplies the substrate (S) placed onto the second hand forks 2710 of the fifth substrate transfer unit 2700 to the first substrate transfer unit 200. The substrate cleaning/drying apparatus 30 allows the second hand forks 2710 to slide leftward/rightward to be positioned at both sides of the second fork support bar 2720, and lowers the second hand forks 2710 to avoid the substrate (S).

In the substrate cleaning/drying apparatus 30 according to the third embodiment of the present disclosure, the hand forks 2310 and 2710 of the second and fifth substrate transfer units slide leftward/rightward to be positioned at both sides of the fork support bar 2320 and 2720. However, the disclosure is not limited to the above embodiment. Instead, the hand forks 2310 and 2710 of the second and fifth substrate transfer units may slide leftward/rightward to be positioned at one side of the fork support bar 2320 and 2720.

FIGS. 13A to 13H illustrate a method for cleaning/drying the substrate through the use of substrate cleaning/drying apparatus according to the first embodiment of the present disclosure.

The substrate cleaning/drying method using the substrate cleaning/drying apparatus 10 according to the first embodiment of the present disclosure will be described with reference to FIGS. 13A to 13H.

Figure 13A:
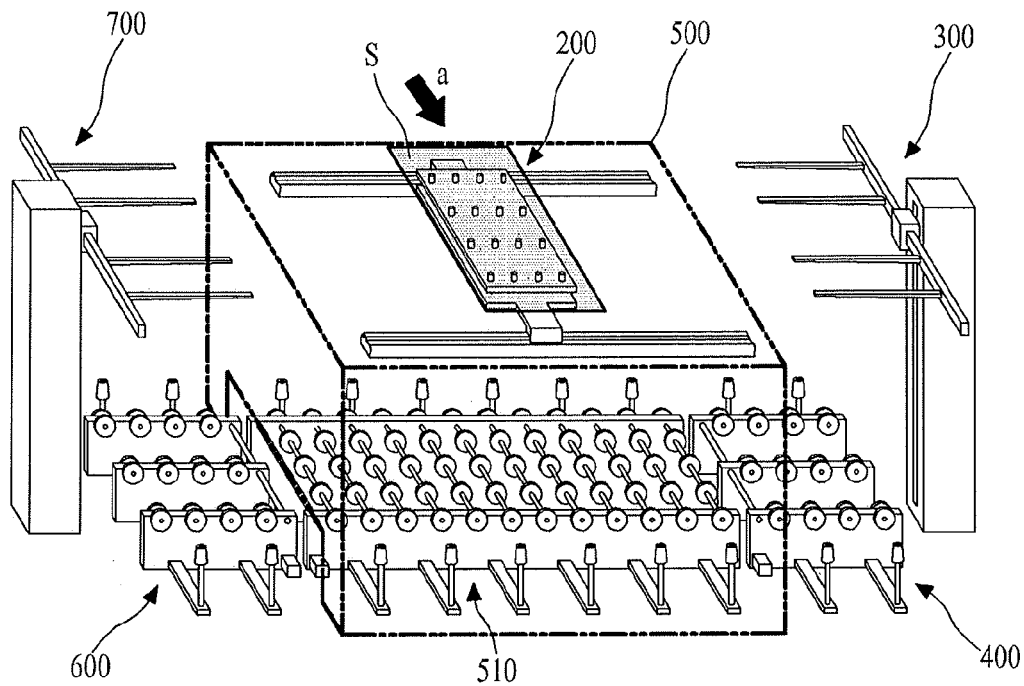
FIGS. 13A to 13H illustrate a method for cleaning/drying a substrate through the use of substrate cleaning/drying apparatus according to the first embodiment of the present disclosure.

First, as shown in FIG. 13A, the substrate (S) is loaded onto the first substrate transfer unit 200 from the exterior through the substrate entrance of the base frame 100 (a).

Figure 13B:
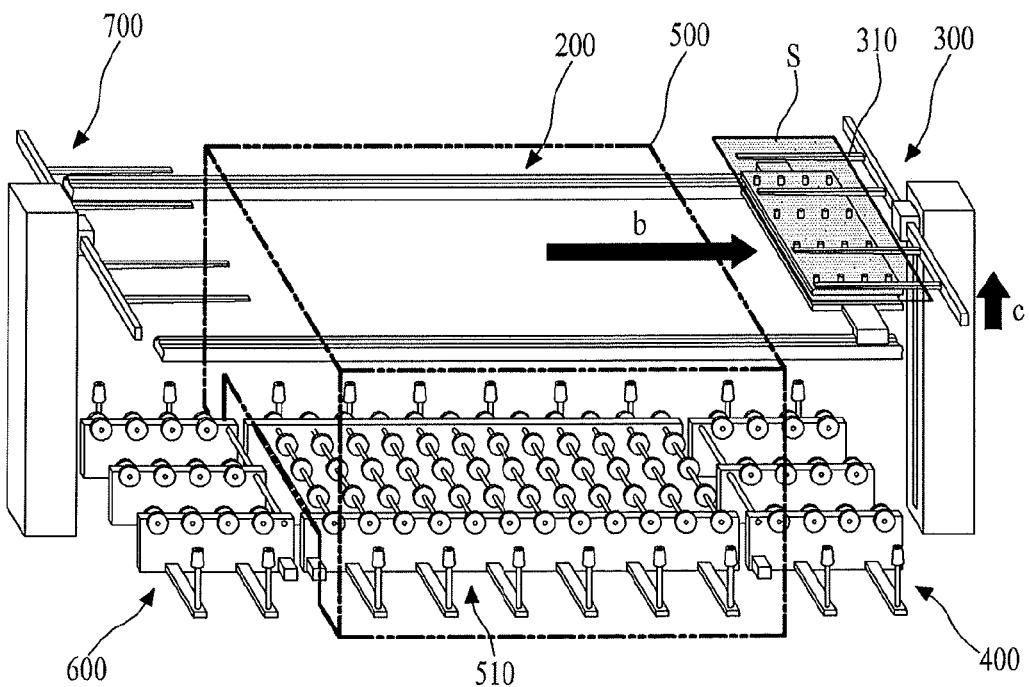

Then, as shown in FIG. 13B, when the substrate (S) is supported on the first substrate transfer unit 200, the first substrate transfer unit 200 is transferred in the horizontal direction toward the second substrate transfer unit 300, whereby the substrate (S) is transferred to the first vertical transfer position (b). In this case, the first substrate transfer unit 200 may rotate the supported substrate (S) by the predetermined angle.

Then, if the substrate (S) is positioned at the first vertical transfer position, the first hand forks 310 of the second substrate transfer unit 300 inserted between the first substrate transfer unit 200 and the substrate (S) are lifted to the predetermined height so that the substrate (S) supported on the first substrate transfer unit 200 is transferred to the first hand forks 310 (c).

Figure 13C:
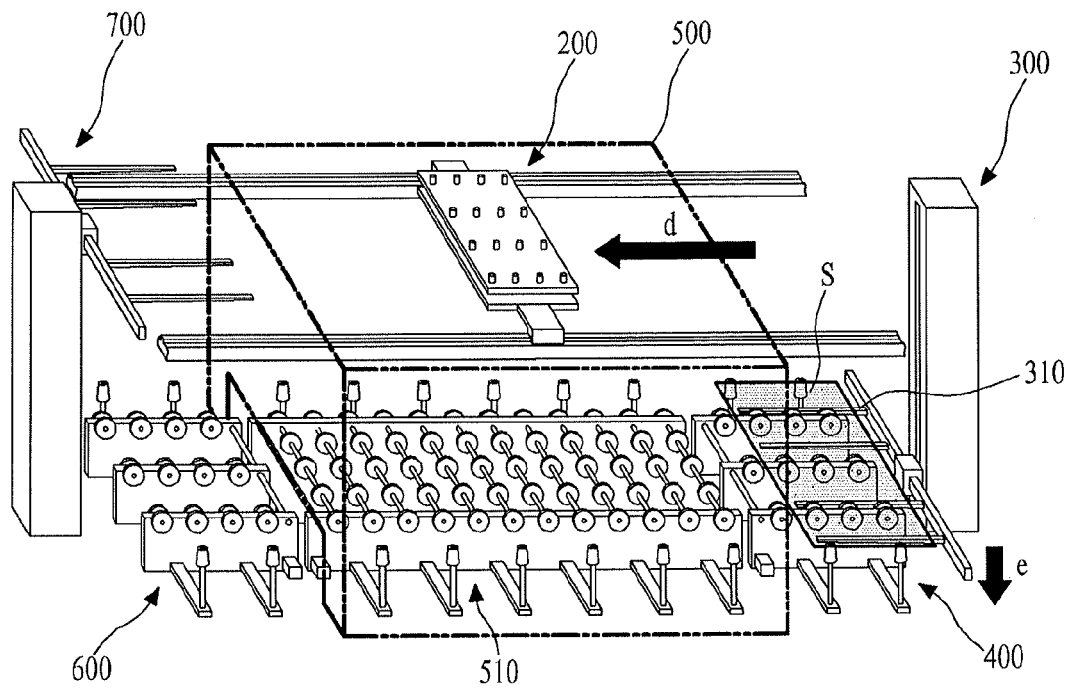

As shown in FIG. 13C, the first substrate transfer unit 200 is horizontally transferred toward the substrate entrance (d).

If the first substrate transfer unit 200 is horizontally transferred toward the substrate entrance beyond the length of the plurality of first hand forks 310, the plurality of first hand forks 310 are lowered toward the first horizontal transfer position, and the substrate (S) supported by the plurality of first hand forks 310 is transferred to the first horizontal transfer position (e). The plurality of first hand forks 310 are lowered by passing through the interval between each of the plurality of first roller frames 410a, 410b, and 410c, and the substrate (S) supported by the plurality of first hand forks 310 is placed onto the plurality of first roller frames 410a, 410b, and 410c.

Figure 13D:
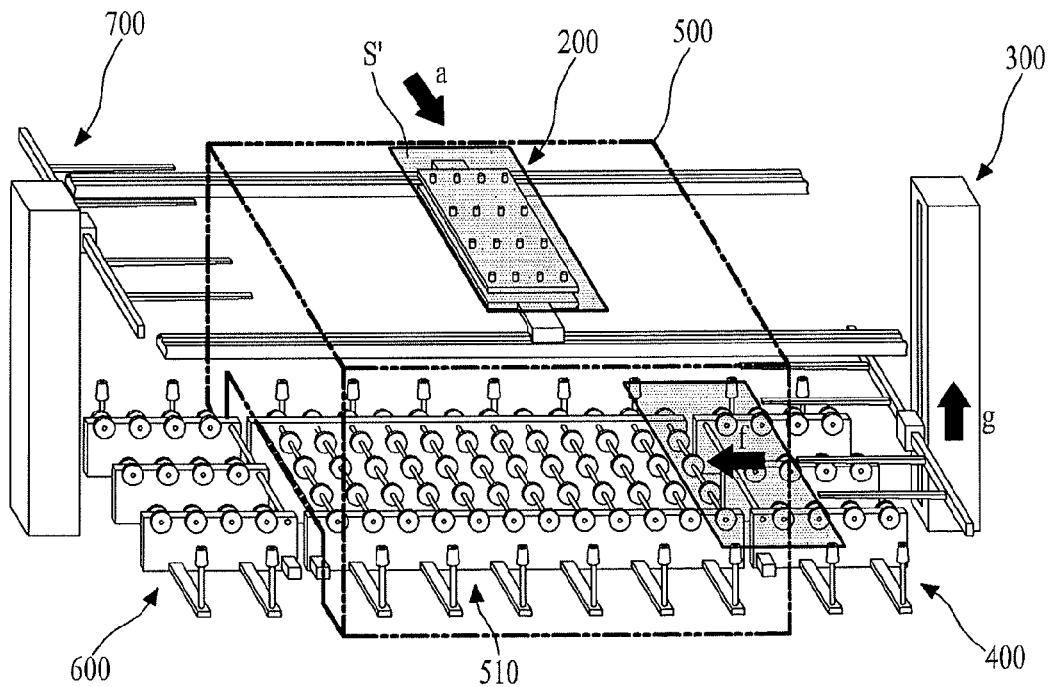

Then, as shown in FIG. 13D, the substrate (S) positioned at the first horizontal transfer position is horizontally transferred toward the substrate processing unit 500 by driving the plurality of first roller frames 410a, 410b, and 410c (f).

When the substrate (S) is horizontally transferred from the first horizontal transfer position toward the substrate processing unit 500 beyond the length of the plurality of first hand forks 310, the plurality of first hand forks 310 are lifted (g). At this time, the substrate (S) is loaded into the substrate processing unit 500.

Figure 13E:
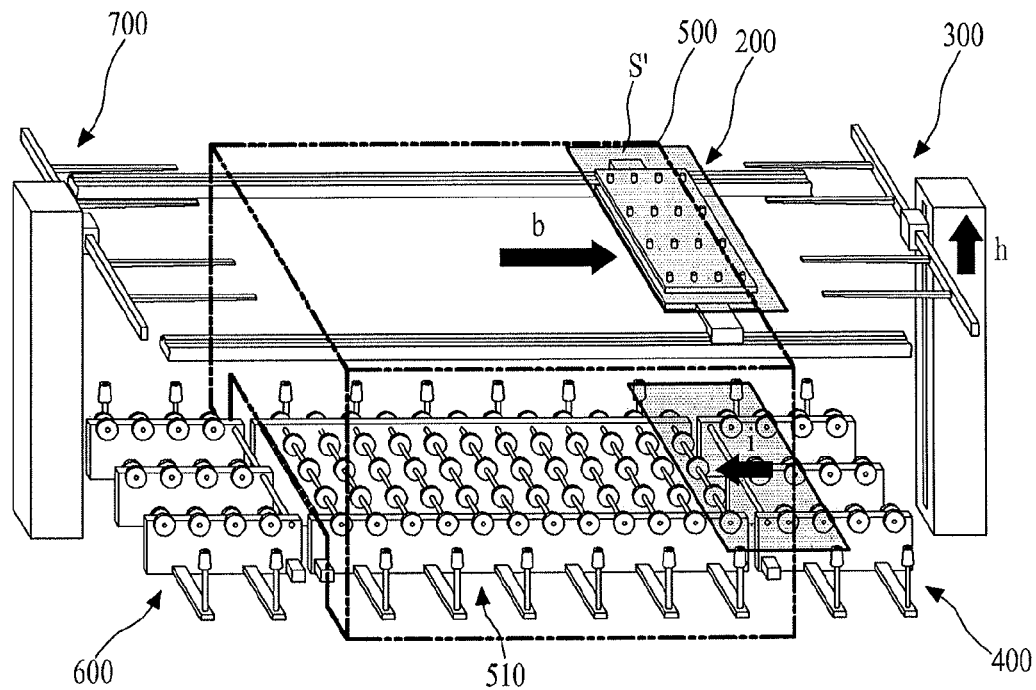

Then, as shown in FIG. 13E, the plurality of first hand forks 310 are lifted in sequence so that the plurality of first hand forks 310 are restored to the first vertical transfer position (h). At this time, the substrate (S) is cleaned and dried while being transferred in the horizontal direction driven by the roller conveyor 510 (i). Also, the first substrate transfer unit 200 transfers the newly-supplied substrate (S') loaded through the substrate entrance to the first vertical transfer position by the aforementioned processes (a) and (b).

Figure 13F:
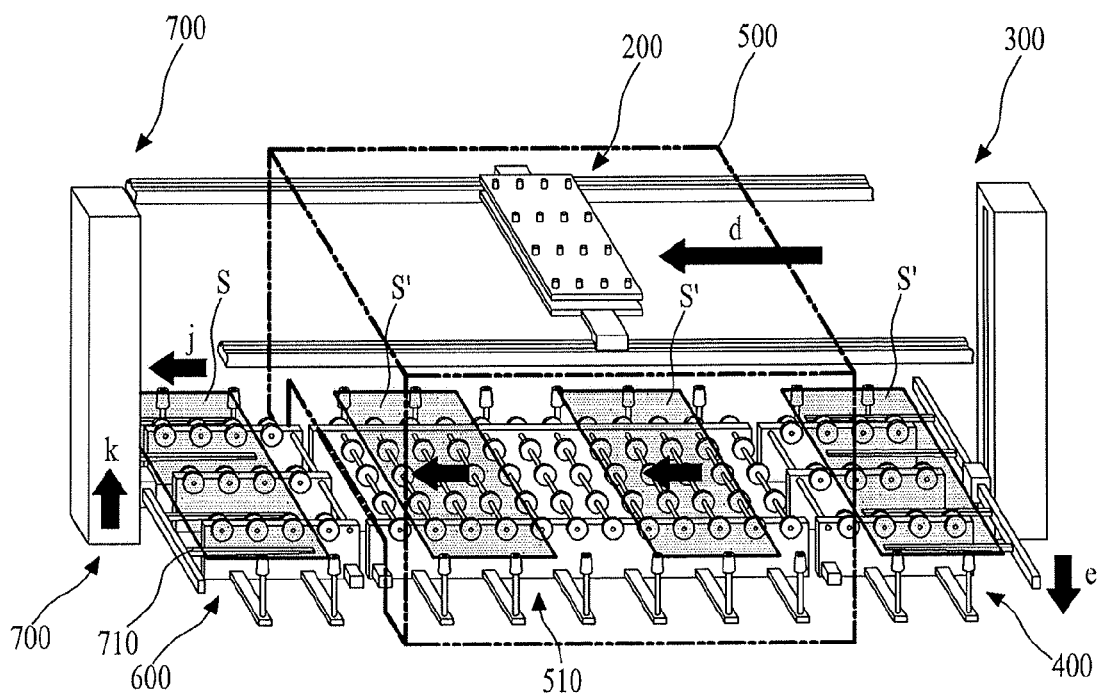

As shown in FIG. 13F, each of the first to third substrate transfer units 200, 300, and 400 repeatedly carries out the aforementioned processes (a) to (i) so as to load the newly-provided substrate (S') to the substrate processing unit 500 at fixed time intervals.

Then, the cleaned substrate (S) discharged from the substrate processing unit 500 after the cleaning and drying process is horizontally transferred to the second vertical transfer position by driving the second roller frames 610a, 610b, and 610c of the fourth substrate transfer unit 600 (j).

When the cleaned substrate (S) is transferred to and positioned at the second vertical transfer position, the plurality of second hand forks 710 lowered to pass through the interval between each of the plurality of second roller frames 610a, 610b, and 610c are lifted toward the second horizontal transfer position (k).

Figure 13G:
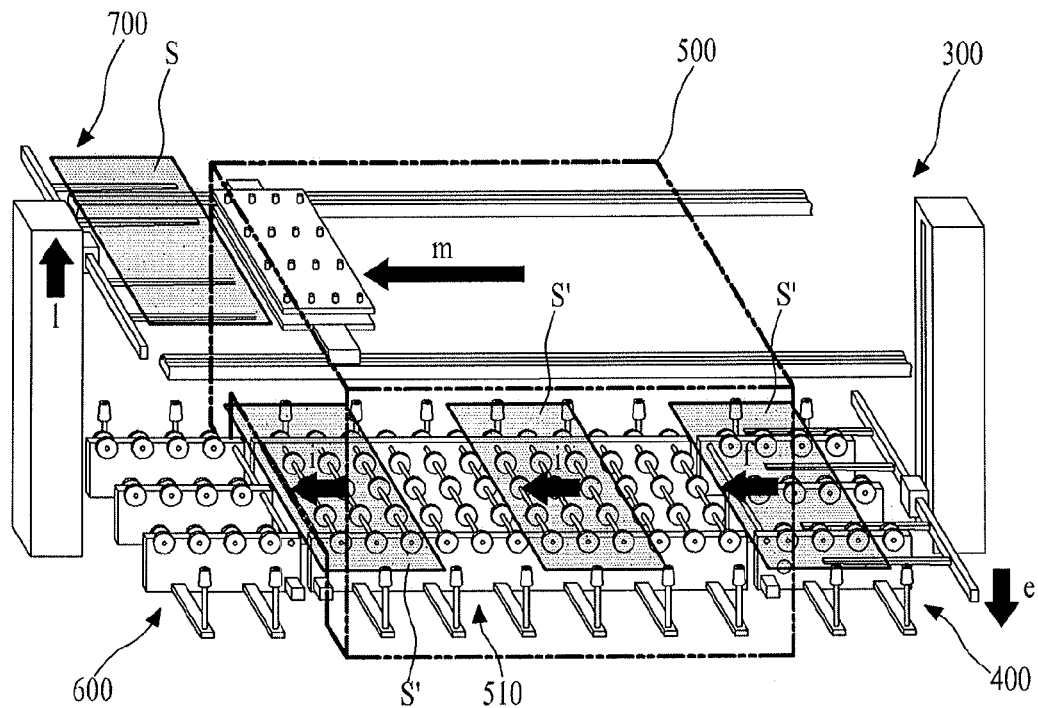

As shown in FIG. 13G, when the plurality of second hand forks 710 are lifted in sequence to be positioned at the second horizontal transfer position (l), the first substrate transfer unit 200 is horizontally transferred to the second horizontal transfer position (m).

Figure 13H:
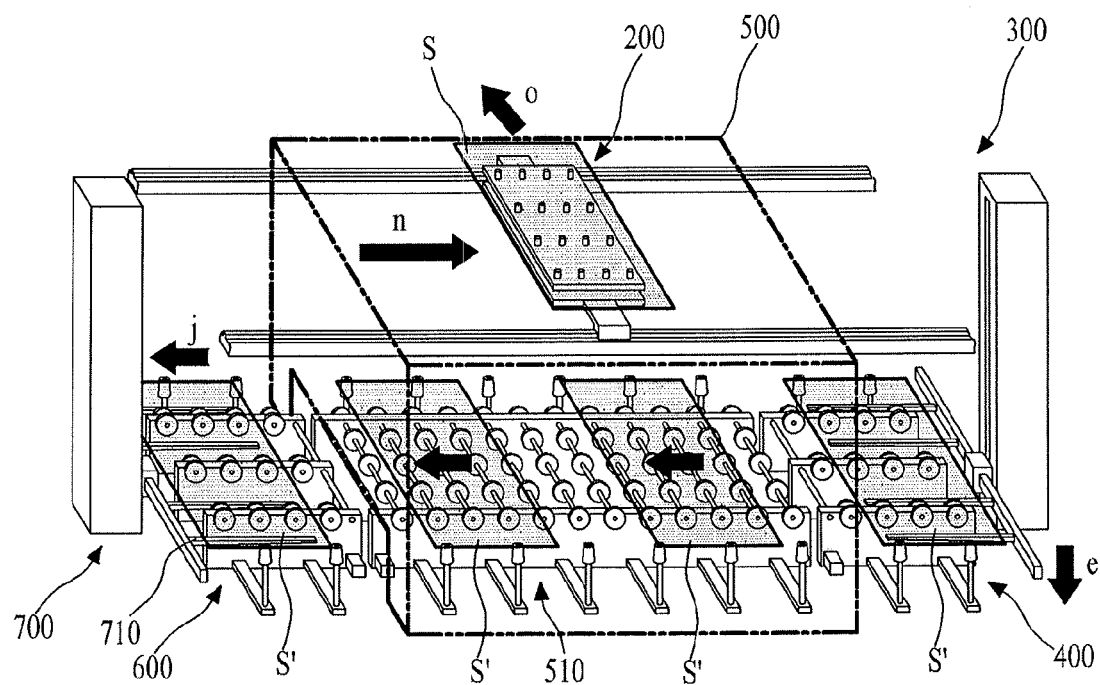

As shown in FIG. 13H, when the first substrate transfer unit 200 is transferred to and positioned at the second horizontal transfer position, the plurality of second hand forks 710 are lowered to the predetermined height, and then the cleaned substrate (S) is transferred to the first substrate transfer unit 200.

Then, when the cleaned substrate (S) is supported on the first substrate transfer unit 200, the first substrate transfer unit 200 is horizontally transferred toward the substrate entrance (n).

Then, if the first substrate transfer unit 200 is horizontally transferred toward the substrate entrance beyond the length of the plurality of second hand forks 710, the plurality of second hand forks 710 are lowered toward the second vertical transfer position. At this time, the plurality of second hand forks 710 are lowered to the vertical transfer position by passing through the interval between each of the plurality of second roller frames 610a, 610b, and 610c.

Also, when the first substrate transfer unit 200 is transferred to and positioned at the substrate entrance, the substrate (S) supported by the first substrate transfer unit 200 is discharged to the exterior (o).

The substrate cleaning/drying method using the substrate cleaning/drying apparatus 10 according to the first embodiment of the present disclosure may carry out the cleaning and drying process for the substrate (S) by repeatedly applying the aforementioned processes (a) to (o) shown in FIGS. 13A to 13H, to thereby clean the substrate (S).

Figure 14A:
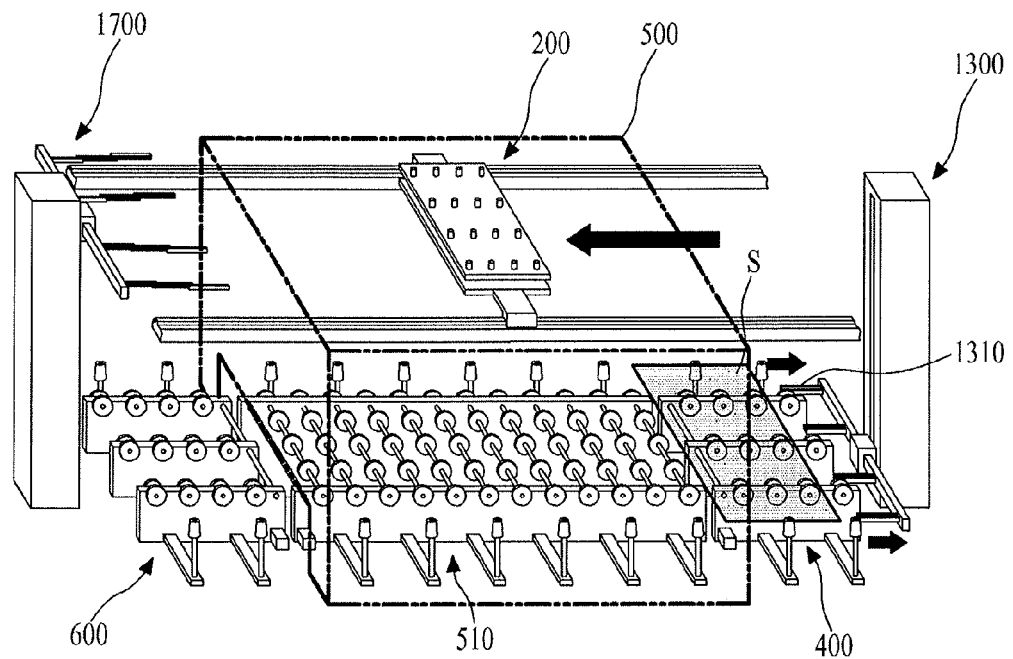
FIGS. 14A and 14B illustrate a partial process among a method for cleaning/drying a substrate through the use of substrate cleaning/drying apparatus according to the second embodiment of the present disclosure.
Figure 14B:
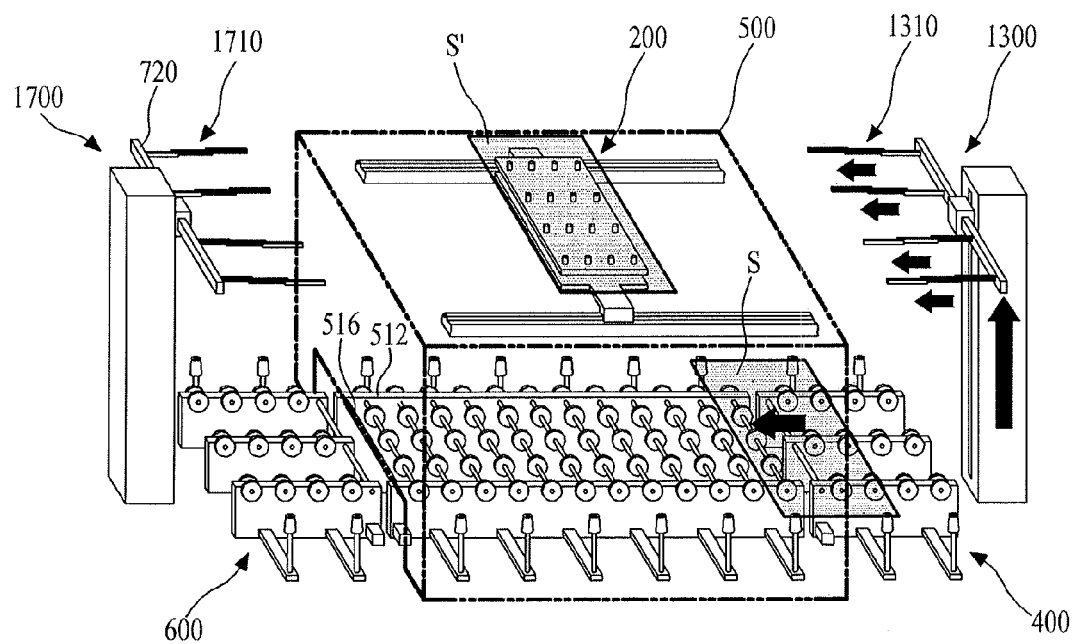

FIGS. 14A and 14B illustrate a partial process among a method for cleaning/drying the substrate through the use of substrate cleaning/drying apparatus according to the second embodiment of the present disclosure.

The substrate cleaning/drying method using the substrate cleaning/drying apparatus 20 according to the second embodiment of the present disclosure will be described with reference to FIGS. 14A and 14B in connection with FIG. 7.

First, the substrate (S) is transferred to the first horizontal transfer position by repeatedly carrying out the aforementioned processes (a) to (e) shown in FIGS. 13A to 13C.

Then, as shown in FIG. 14A, when the substrate (S) supported by the first hand forks 1310 is placed onto the plurality of first roller frames 410a, 410b, and 410c by lowering the plurality of first hand forks 1310, as mentioned above, the substrate (S) is horizontally transferred toward the substrate processing unit 500 by driving the plurality of first roller frames 410a, 410b, and 410c. At the same time, the first to third sliding bars 1311, 1313, and 1315 in each of the plurality of first hand forks 1310 slide in the horizontal direction to be folded toward the substrate-avoidance position, that is, the first fork support bar 320.

Then, as shown in FIG. 14B, when the substrate (S) is horizontally transferred toward the substrate processing unit 500 beyond the length of the plurality of first hand forks 1310 in the substrate-avoidance position, the folded first hand forks 1310 are lifted to the first vertical transfer position.

Then, when the folded first hand forks 1310 are lifted to and positioned at the first vertical transfer position, the first to third sliding bars 1311, 1313, and 1315 in each of the first hand forks 1310 are stretched by the sliding in the horizontal direction. The first to third sliding bars 1311, 1313, and 1315 in each of the first hand forks 1310 may be stretched to the substrate-support position by sliding in the horizontal direction while being lifted to the first vertical transfer position.

Then, each of the first to third substrate transfer units 200, 1300, and 400 repeatedly carries out the aforementioned processes (a) to (e) shown in FIGS. 13A to 13C, and the aforementioned processes shown in FIGS. 14A and 14B, whereby the substrate (S) is transferred toward the substrate processing unit 500.

Similar to the aforementioned FIG. 13F, the second roller frames 610a, 610b, and 610c of the fourth substrate transfer unit 600 are driven so that the cleaned substrate (S) discharged from the substrate processing unit 500 after the cleaning and drying process is horizontally transferred to the second vertical transfer position.

Then, when the cleaned substrate (S) is transferred to and positioned at the second vertical transfer position, the plurality of second hand forks 1710 lowered to pass through the interval between each of the plurality of second roller frames 610a, 610b, and 610c are lifted toward the second horizontal transfer position.

Similar to the aforementioned FIG. 13G, when the plurality of second hand forks 1710 are lifted in sequence to be positioned at the second horizontal transfer position, the first substrate transfer unit 200 is horizontally transferred to the second horizontal transfer position.

Then, when the first substrate transfer unit 200 is horizontally transferred to be positioned between the second hand forks 1710 and the cleaned substrate (S), the second hand forks 1710 are lowered to the predetermined height, and then the cleaned substrate (S) is transferred to the first substrate transfer unit 200. Then, after horizontally transferring the first substrate transfer unit 200 toward the substrate entrance and simultaneously folding the first and third sliding bars in each of the second hand forks 1710, the first substrate transfer unit 200 is horizontally transferred toward the substrate entrance. When the first substrate transfer unit 200 is horizontally transferred beyond the length of the folded second hand forks 1710, then the folded second hand forks 1710 are lowered to the second vertical transfer position. If the first substrate transfer unit 200 is transferred to the substrate entrance, the substrate (S) supported by the first substrate transfer unit 200 is discharged to the exterior.

Then, when the folded second hand forks 1710 are lowered to the second vertical transfer position, the first to third sliding bars in each of the second hand forks 1710 are stretched by sliding in the horizontal direction. The first to third sliding bars in each of the second hand forks 1710 may be stretched by sliding in the horizontal direction while being lowered to the second vertical transfer position.

Figure 15A:
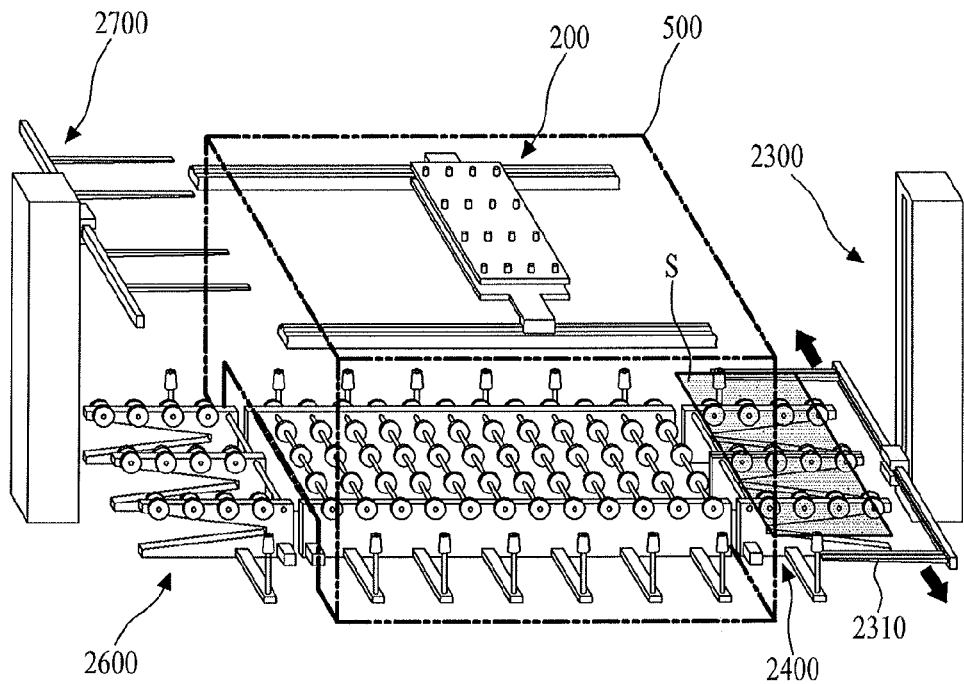
FIGS. 15A and 15B illustrate a partial process among a method for cleaning/drying a substrate through the use of substrate cleaning/drying apparatus according to the third embodiment of the present disclosure.
Figure 15B:
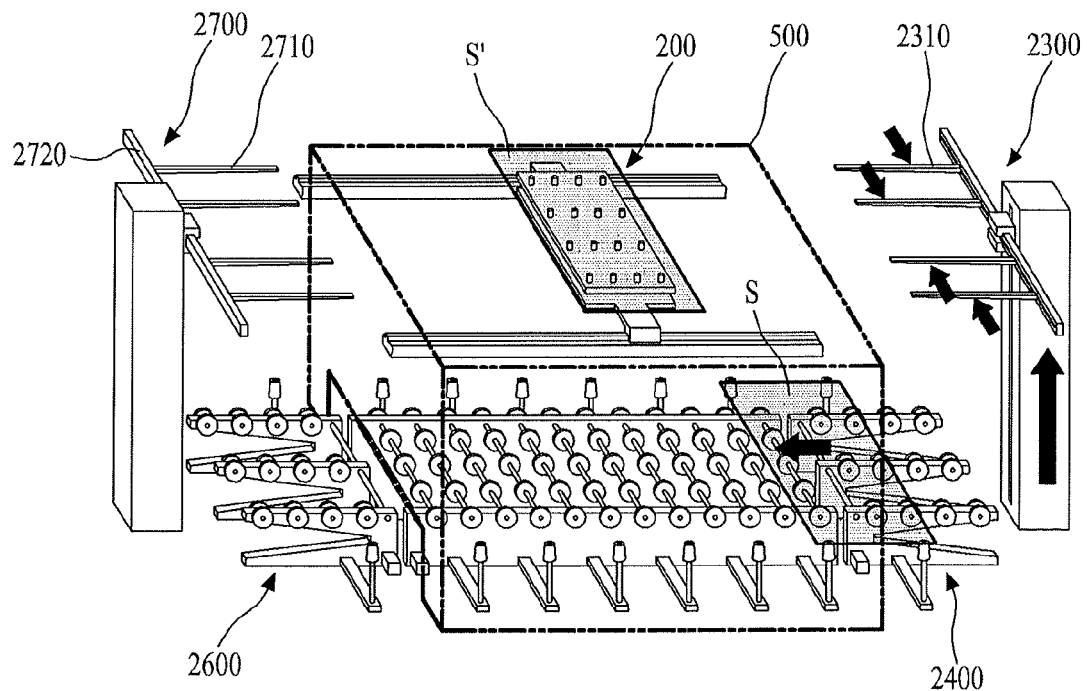

FIGS. 15A and 15B illustrate a partial process among a method for cleaning/drying a substrate through the use of substrate cleaning/drying apparatus according to the third embodiment of the present disclosure.

The substrate cleaning/drying method using the substrate cleaning/drying apparatus 30 according to the third embodiment of the present disclosure will be described with reference to FIGS. 15A and 15B in connection with FIG. 9.

First, the substrate (S) is transferred to the first horizontal transfer position by repeatedly carrying out the aforementioned processes (a) to (e) shown in FIGS. 13A to 13C.

Then, as shown in FIG. 15A, when the substrate (S) supported by the first hand forks 2310 is placed onto the plurality of first roller frames 410a, 410b, and 410c by lowering the plurality of first hand forks 2310, as mentioned above, the substrate (S) is horizontally transferred toward the substrate processing unit 500 by driving the plurality of first roller frames 410a, 410b, and 410c. At the same time, the first hand forks 2310 slide leftward/rightward to be symmetrically positioned at both sides of the first fork support bar 2320. After that, the first hand forks 2310, folded to avoid the substrate (S), are lifted toward the first vertical transfer position.

Then, as shown in FIG. 15B, when the folded first hand forks 2310 are lifted to the first vertical transfer position, the first hand forks 2310 slide to be symmetrically positioned at fixed intervals on the first fork support bar 2320. The sliding process for positioning the first hand forks 2310 at fixed intervals on the first fork support bar 2320 may be carried out during the lifting process to the first vertical transfer position.

Then, each of the first to third substrate transfer units 200, 1300, and 400 repeatedly carries out the aforementioned processes (a) to (e) shown in FIGS. 13A to 13C, and the aforementioned processes shown in FIGS. 15A and 15B, whereby the substrate (S) is transferred toward the substrate processing unit 500.

Similar to the aforementioned FIG. 13F, the second roller frames 610a, 610b, and 610c of the fourth substrate transfer unit 2600 are driven so that the cleaned substrate (S) discharged from the substrate processing unit 500 after the cleaning and drying process is horizontally transferred to the second vertical transfer position.

Then, when the cleaned substrate (S) is transferred to and positioned at the second vertical transfer position, the plurality of second hand forks 2710 lowered to pass through the interval between each of the plurality of second roller frames 610a, 610b, and 610c are lifted toward the second horizontal transfer position.

Similar to the aforementioned FIG. 13G, when the plurality of second hand forks 2710 are lifted in sequence to be positioned at the second horizontal transfer position, the first substrate transfer unit 200 is horizontally transferred to the second horizontal transfer position.

Then, when the first substrate transfer unit 200 is horizontally transferred to be positioned between the second hand forks 2710 and the cleaned substrate (S), the second hand forks 2710 are lowered to the predetermined height so that the cleaned substrate (S) is transferred to the first substrate transfer unit 200. Then, after horizontally transferring the first substrate transfer unit 200 toward the substrate entrance and simultaneously allowing the second hand forks 2710 to slide leftward/rightward to be symmetrically positioned at both sides of the second fork support bar 2720, the second hand forks 2710, folded to avoid the substrate (S), are lowered toward the second vertical transfer position. At the same time, if the first substrate transfer unit 200 is transferred to the substrate entrance, the substrate (S) supported by the first substrate transfer unit 200 is discharged to the exterior.

Then, when the folded second hand forks 2710 are lowered to the second vertical transfer position, the second hand forks 2710 slide leftward/rightward to be symmetrically positioned at fixed intervals on the second fork support bar 2720. The sliding process for positioning the second hand forks 2710 at fixed intervals on the second fork support bar 2720 may be carried out during the lifting process to the second vertical transfer position.

Figure 16:
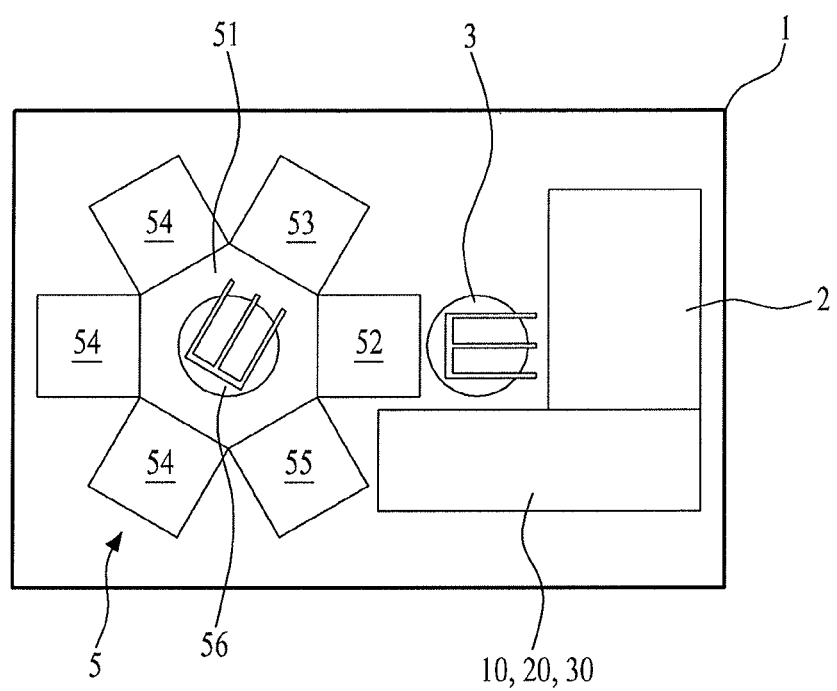
FIG. 16 illustrates a substrate processing apparatus according to the embodiment of the present disclosure.

FIG. 16 illustrates a substrate processing apparatus according to the embodiment of the present disclosure.

Referring to FIG. 16, the substrate processing apparatus according to the embodiment of the present disclosure comprises a clean room 1; a port 2; a substrate conveying unit 3; the substrate cleaning/drying apparatus 10, 20, or 30; and a thin-film forming apparatus 5.

The cleaning room 1 provides a space with a predetermined cleanliness level. The port 2, the substrate cleaning/drying apparatus 10, 20, or 30, and the thin-film forming apparatus 5 are installed inside the cleaning room 1.

The port 2 is installed inside the cleaning room 1, wherein the port 2 loads the substrate, or unloads the cleaned substrate. A cassette (not shown) with the plurality of substrates stacked therein may be loaded into or unloaded from the port 2.

The substrate conveying unit 3 is installed among the port 2, the substrate cleaning/drying apparatus 10, 20, or 30, and the thin-film forming apparatus 5.

The substrate conveying unit 3 receives the substrate from the port 2, and then conveys the received substrate to the substrate cleaning/drying apparatus 10, 20, or 30. The substrate may be any one among various substrates used for a display panel, a semiconductor, and a solar cell.

Also, the substrate conveying unit 3 receives the substrate cleaned by the substrate cleaning/drying apparatus 10, 20, or 30, and conveys the received substrate to the thin-film forming apparatus 5. Also, the substrate conveying unit 3 receives the substrate, on which the thin film is formed by the thin-film forming apparatus 5, and then conveys the received substrate to the port 2.

The substrate cleaning/drying apparatus 10, which corresponds to the substrate cleaning/drying apparatus according to the first embodiment of the present disclosure shown in FIGS. 1 to 5, carries out the cleaning and drying process for the substrate loaded from the substrate conveying unit 3 by the aforementioned substrate cleaning/drying method shown in FIGS. 13A to 13H.

The substrate cleaning/drying apparatus 20, which corresponds to the substrate cleaning/drying apparatus according to the second embodiment of the present disclosure shown in FIGS. 1 to 3B and FIGS. 6 and 7, carries out the cleaning and drying process for the substrate loaded from the substrate conveying unit 3 by the aforementioned substrate cleaning/drying method comprising the substrate transferring method shown in FIGS. 14A and 14B.

The substrate cleaning/drying apparatus 30, which corresponds to the substrate cleaning/drying apparatus according to the first embodiment of the present disclosure shown in FIGS. 1 to 3B and FIGS. 8 to 12, carries out the cleaning and drying process for the substrate loaded from the substrate conveying unit 3 by the aforementioned substrate cleaning/drying method comprising the substrate transferring method shown in FIGS. 15A and 15B.

The thin-film forming apparatus 5 forms the predetermined thin film on the cleaned substrate loaded by the substrate conveying unit 3. The thin-film forming apparatus 5 may comprise a transfer chamber 51, a loadlock chamber 52, a preheat chamber 53, a plurality of processing chambers 54, and a cooling chamber 55.

The transfer chamber 51 is arranged in the center among the chambers 52 to 55, and the transfer chamber 51 conveys the substrate among the chambers 52 to 55. The transfer chamber 51 comprises a convey robot 56 for conveying the substrate. The transfer chamber 51 is surrounded by the loadlock chamber 52, preheat chamber 53, plurality of processing chambers 54, and cooling chamber 55 arranged in a cluster type.

The loadlock chamber 52 is arranged adjacent to the substrate conveying unit 3, and is connected to the transfer chamber 51. The substrate supplied by the substrate conveying unit 3 may be temporarily stored in the loadlock chamber 52. The substrate with the thin film supplied by the transfer chamber 51 may also be temporarily stored in the loadlock chamber 52.

The preheat chamber 53 preheats the substrate supplied from the loadlock chamber 52 by the convey robot 56 so that the temperature of the substrate is higher than a predetermined temperature for thin film deposition process. At this time, the temperature of the preheated substrate is determined in consideration of cooling margins such as the conveying time of the substrate from the preheat chamber 53 to the plurality of processing chambers 54, the processing time in the plurality of processing chambers 54, and the processing temperature. The preheat chamber 53 preheats the substrate to the predetermined temperature through the use of heating apparatus such as a coil heater or lamp heater.

The loadlock chamber 52 and preheat chamber 53 may be formed in a stack structure. That is, the loadlock chamber 52 may be positioned under the preheat chamber 53.

The plurality of processing chambers 54 receive the substrate preheated in the preheat chamber 53 through the use of convey robot 56, and applies the thin film deposition process using chemical vapor deposition or sputtering to the preheated substrate.

The cooling chamber 55 receives the substrate on which the thin film is formed by the plurality of processing chambers 54 through the use of convey robot 56. The cooling chamber 55 then lowers the temperature of substrate preheated by the thin film deposition process to the predetermined temperature. If the manufacturing process and the post-manufacturing steps do not require a temperature-cooling process, the cooling chamber 55 may be substituted by the processing chamber 54.

The substrate cleaning/drying apparatus 10, 20, or 30 may apply the cleaning and drying process to the substrate with the thin film formed by the thin-film forming apparatus 5.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The invention claimed is:

1. A substrate cleaning and drying apparatus comprising:
a first substrate transfer unit operable to transfer a substrate in a horizontal direction at an upper part of a base frame;
a second substrate transfer unit operable to receive the substrate from the first substrate transfer unit and transfer the substrate in a vertical direction;
a third substrate transfer unit operable to receive the substrate from the second substrate transfer unit and transfer the substrate in the horizontal direction at a lower part of the base frame; and
a substrate processing unit operable to receive the substrate from the third substrate transfer unit and perform a cleaning and drying process on the substrate to clean and dry the substrate,
wherein the second substrate transfer unit includes a plurality of first forks operable to support the substrate,
wherein the third substrate transfer unit includes a plurality of first roller frames disposed parallel to each other at a fixed interval in parallel to a longitudinal direction of the plurality of first forks so that the plurality of first forks pass through the plurality of first roller frames in the vertical direction,
wherein each of the plurality of first roller frames comprises:
a first support frame disposed in the horizontal direction;
a notch formed in the first support frame adjacent to the second substrate transfer unit and extending in the horizontal direction such that the first support frame is in the shape of a "⊂",
a plurality of first rollers installed at one side of the first support frame to avoid an obstruction in track of the plurality of first forks, and transferring the substrate received from the plurality of first forks to the substrate processing unit,
wherein the plurality of first forks directly receives the substrate from the first substrate transfer unit, lifts in the vertical direction between first rollers of different first roller frames, and directly transfers the substrate received from the first substrate transfer unit to the plurality of first rollers, and
wherein all the plurality of first forks are operable to slide symmetrically in both directions perpendicular to the horizontal direction, and pass through the notches of the first support frames during sliding.

2. The apparatus of claim 1, wherein the second substrate transfer unit further comprises a first fork support bar coupled to an end of each of the plurality of first forks, and a first lift operable to move the first fork support bar in a vertical direction, the first fork support bar including:
a bar frame disposed along the longitudinal direction perpendicular to the horizontal direction;
a sliding slit disposed along the longitudinal direction at a side of the bar frame for allowing the plurality of first forks to pass through; and
a fork sliding module coupled to the plurality of first forks operable to slide the plurality of first forks in the longitudinal direction.

3. The apparatus of claim 2, wherein the fork sliding module comprises:
a sliding guide unit disposed at an end of each of the plurality of first forks, the sliding guide unit including a plurality of sliding rails disposed at a bottom of the bar frame at fixed intervals in parallel to a longitudinal direction of the bar frame;
a plurality of ball screw units coupled to the ends of each of the plurality of first forks, the plurality of ball screw units operable to slide the plurality of first forks in the longitudinal direction perpendicular to the horizontal direction along the plurality of sliding rails; and
a sliding sensor unit operable to detect a sliding position of each of the plurality of first forks.

4. The apparatus of claim 3, wherein the sliding sensor unit comprises:
a sensor rail disposed at an inner surface of the bar frame and divided into multiple portions, each portion having a length corresponding to a sliding distance of each of the plurality of first forks;
a plurality of sensor dogs, each of the plurality of sensor dogs installed at one side of each of the plurality of first forks, where each sensor dog protrudes by a predetermined length toward the sensor rail; and
a plurality of position sensors, each of the plurality of position sensors disposed on the sensor rail, at a position corresponding to the sliding distance of each of the plurality of first forks.

5. The apparatus of claim 1, wherein the first substrate transfer unit comprises:
a plurality of rails disposed on the upper part of the base frame, the plurality of rails disposed at a predetermined interval in parallel to the horizontal direction;
a transfer frame movably disposed on the plurality of rails;
a support axis disposed on the transfer frame;
a support plate disposed on the support axis operable to support the substrate, the support axis supporting the support plate; and
a plurality of support pins disposed on the support plate with a predetermined height operable to support the substrate.

6. The apparatus of claim 5, wherein the first substrate transfer unit further comprises a substrate rotation unit disposed below the transfer frame and coupled to the support axis, the substrate rotation unit operable to rotate the support axis by a predetermined angle.

7. A substrate processing apparatus, comprising:
a clean room;
a port disposed in the clean room operable to load and unload a substrate;
a thin-film forming apparatus disposed in the clean room operable to form a predetermined film on the substrate;
a substrate cleaning and drying apparatus disposed in the clean room comprising:
a first substrate transfer unit operable to transfer the substrate in a horizontal direction at an upper part of a base frame;
a second substrate transfer unit operable to receive the substrate from the first substrate transfer unit and transfer the substrate in a vertical direction;
a third substrate transfer unit operable to receive the substrate from the second substrate transfer unit and transfer the substrate in the horizontal direction at a lower part of the base frame;
a substrate processing unit operable to receive the substrate from the third substrate transfer unit and perform a cleaning and drying process on the substrate to clean and dry the substrate,
wherein the second substrate transfer unit includes a plurality of first forks operable to support the substrate, wherein the third substrate transfer unit includes a plurality of first roller frames disposed parallel to each other at a fixed interval in parallel to a longitudinal direction of the plurality of first forks so that the plurality of first hand forks pass through the plurality of first roller frames in the vertical direction, wherein each of the plurality of first roller frames comprises:

a first support frame disposed in the horizontal direction;

a notch formed in the first support frame adjacent to the second substrate transfer unit and extending in the horizontal direction such that the first support frame is in the shape of a "⊂", a plurality of first rollers installed at one side of the first support frame to avoid an obstruction in track of the plurality of first forks, and transferring the substrate received from the plurality of first forks to the substrate processing unit, wherein the plurality of first forks directly receives the substrate from the first substrate transfer unit, lifts in the vertical direction between first rollers of different first roller frames, and directly transfers the substrate received from the first substrate transfer unit to the plurality of first rollers, and wherein all the plurality of first forks are operable to slide symmetrically in both directions perpendicular to the horizontal direction, and pass through the notches of the first support frames during sliding, and a substrate conveying unit disposed in the clean room operable to:

receive the substrate from the port and conveying the received substrate to the substrate cleaning and drying apparatus, receive the substrate from the substrate cleaning and drying apparatus and conveying the substrate to the thin-film forming apparatus, and receive the substrate from the thin-film forming apparatus and conveying the received substrate to the port.

8. The apparatus of claim 7, wherein the second substrate transfer unit further comprises a first fork support bar coupled to an end of each of the plurality of first forks, and a first lift operable to move the first fork support bar in a vertical direction, the first fork support bar including:

a bar frame disposed along the longitudinal direction perpendicular to the horizontal direction;

a sliding slit disposed along the longitudinal direction at a side of the bar frame for allowing the plurality of first forks to pass through; and a fork sliding module coupled to the plurality of first forks operable to slide the plurality of first forks in the longitudinal direction.

9. The apparatus of claim 8, wherein the fork sliding module comprises:

a sliding guide unit disposed at an end of each of the plurality of first forks, the sliding guide unit including a plurality of sliding rails disposed at a bottom of the bar frame at fixed intervals in parallel to a longitudinal direction of the bar frame;

a plurality of ball screw units coupled to the ends of each of the plurality of first forks, the plurality of ball screw units operable to slide the plurality of first forks in the longitudinal direction perpendicular to the horizontal direction along the plurality of sliding rails; and a sliding sensor unit operable to detect a sliding position of each of the plurality of first forks.

10. The apparatus of claim 9, wherein the sliding sensor unit comprises:

a sensor rail disposed at an inner surface of the bar frame and divided into multiple portions, each portion having a length corresponding to a sliding distance of each of the plurality of first forks;

a plurality of sensor dogs, each of the plurality of sensor dogs installed at one side of each of the plurality of first forks, where each sensor dog protrudes by a predetermined length toward the sensor rail; and a plurality of position sensors, each of the plurality of position sensors disposed on the sensor rail, at a position corresponding to the sliding distance of each of the plurality of first forks.

11. The apparatus of claim 7, wherein the first substrate transfer unit comprises:

a plurality of rails disposed on the upper part of the base frame, the plurality of rails disposed at a predetermined interval in parallel to the horizontal direction;

a transfer frame movably disposed on the plurality of rails;

a support axis disposed on the transfer frame;

a support plate disposed on the support axis operable to support the substrate, the support axis supporting the support plate; and a plurality of support pins disposed on the support plate with a predetermined height operable to support the substrate.

12. The apparatus of claim 11, wherein the first substrate transfer unit further comprises a substrate rotation unit disposed below the transfer frame and coupled to the support axis, the substrate rotation unit operable to rotate the support axis by a predetermined angle.

\* \* \* \* \*